United States Patent
Hong et al.

(10) Patent No.: US 10,825,759 B2
(45) Date of Patent: Nov. 3, 2020

(54) POWER MODULE AND PRODUCTION METHOD OF THE SAME

(71) Applicant: Delta Electronics (Shanghai) Co., Ltd., Shanghai (CN)

(72) Inventors: Shouyu Hong, Shanghai (CN); Wei Cheng, Shanghai (CN); Ganyu Zhou, Shanghai (CN); Xin Zou, Shanghai (CN); Zhenqing Zhao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/292,342

(22) Filed: Mar. 5, 2019

(65) Prior Publication Data

US 2019/0273034 A1    Sep. 5, 2019

(30) Foreign Application Priority Data

Mar. 5, 2018   (CN) ............... 2018 1 0178717

(51) Int. Cl.
*H01L 23/34*     (2006.01)
*H01L 23/48*     (2006.01)
*H01L 21/00*     (2006.01)
*H01L 21/44*     (2006.01)
*H01L 23/498*    (2006.01)
(Continued)

(52) U.S. Cl.
CPC ........ *H01L 23/498* (2013.01); *H01L 21/4878* (2013.01); *H01L 23/3735* (2013.01);
(Continued)

(58) Field of Classification Search
CPC ............... H01L 23/498; H01L 21/4878; H01L 23/3735; H01L 24/32; H01L 24/83; H01L 24/29; H01L 24/33
See application file for complete search history.

(56) References Cited

U.S. PATENT DOCUMENTS 6,485,816 B2 * 11/2002 Araki .............. H01L 23/3733
                                                        257/E23.098
7,170,186 B2 *  1/2007 Araki .............. H01L 23/3733
                                                        257/702
(Continued)

FOREIGN PATENT DOCUMENTS

CN        1815720 A     8/2006
CN      101611490 A    12/2009
(Continued)

OTHER PUBLICATIONS

Corresponding China office action dated Jul. 1, 2019.
Corresponding extended European search report dated Jul. 31, 2019.

*Primary Examiner* — Alonzo Chambliss
(74) *Attorney, Agent, or Firm* — CKC & Partners Co., LLC

(57) ABSTRACT

A power module and a production method of the same, wherein a metal substrate is connected with the connection substrate in a high temperature, and in a process of cooling from a high temperature to a low temperature, an upper surface and a lower surface of the metal substrate are bendingly deformed toward the connection substrate, and the upper surface of the metal substrate is formed as a curved surface protruding toward the connection substrate, then the lower surface of the metal substrate is processed into a plane. In the power module and the production method of the disclosure, the second bonding material between the metal substrate and the connection substrate has a larger edge thickness, which reduces the thermal stress that the edge of the second bonding material is subject to, thereby improving the reliability of the power module while the power module has good heat dissipation performance.

26 Claims, 12 Drawing Sheets

(51) Int. Cl.
  *H01L 23/373*  (2006.01)
  *H01L 23/00*   (2006.01)
  *H01L 21/48*   (2006.01)
  *H01L 25/07*   (2006.01)
(52) U.S. Cl.
  CPC .............. *H01L 24/29* (2013.01); *H01L 24/32* (2013.01); *H01L 24/33* (2013.01); *H01L 24/83* (2013.01); *H01L 25/072* (2013.01); *H01L 2224/32225* (2013.01); *H01L 2224/8384* (2013.01); *H01L 2224/83815* (2013.01); *H01L 2224/83948* (2013.01); *H01L 2924/3511* (2013.01)

(56) References Cited

U.S. PATENT DOCUMENTS

| | | |
|---|---|---|
| 9,502,271 B2 | 11/2016 | Yu et al. |
| 9,570,421 B2 | 2/2017 | Wu et al. |
| 2008/0157345 A1 | 7/2008 | Lu et al. |
| 2015/0221609 A1* | 8/2015 | Srinivasan ............. H01L 24/81 438/122 |
| 2017/0216948 A1 | 8/2017 | Park et al. |
| 2018/0240730 A1 | 8/2018 | Hirao et al. |
| 2019/0164760 A1* | 5/2019 | Joshi ..................... H01L 24/29 |

FOREIGN PATENT DOCUMENTS

| | | |
|---|---|---|
| CN | 201508833 U | 6/2010 |
| CN | 104952813 A | 9/2015 |
| CN | 107527827 A | 12/2017 |
| JP | 02077143 | 3/1990 |
| JP | H10270612 A | 10/1998 |
| JP | 2000332052 A | 11/2000 |
| JP | 2011243683 A | 12/2011 |
| JP | 2011249472 | 12/2011 |
| JP | 2015043405 A | 3/2015 |
| JP | 2017073483 A | 4/2017 |
| JP | 2018129325 A | 8/2018 |

* cited by examiner

```
┌─────────────────────────────────────────────────────────────┐
│  Providing a power chip, a first bonding material, a connection substrate,  │  S101
│     a second bonding material, and a metal substrate, where an upper        │
│   surface and a lower surface of the metal substrate may be planes. But     │
│   the upper and lower surfaces of the metal substrate may not be planes     │
│    either, for example, the upper surface can be a convex surface and the   │
│          lower surface can be a concave surface or a convex surface         │
└─────────────────────────────────────────────────────────────┘
                                    │
                                    ▼
┌─────────────────────────────────────────────────────────────┐
│   Stacking the power chip, the first bonding material, the connection       │  S102
│  substrate, the second bonding material, and the metal substrate together   │
│     in sequence and heating them to 180°C ~ 350°C, where the second         │
│      bonding material is in contact with the upper surface of the metal     │
│                                  substrate                                  │
└─────────────────────────────────────────────────────────────┘
                                    │
                                    ▼
┌─────────────────────────────────────────────────────────────┐
│    Cooling the power chip, the first bonding material, the connection       │
│  substrate, the second bonding material and the metal substrate to -10°C    │
│   ~ 40°C. A coefficient of thermal expansion of the connection substrate    │  S103
│         is smaller than a coefficient of thermal expansion of the metal     │
│      substrate, and the upper surface and the lower surface of the metal    │
│        substrate are bendingly deformed toward the connection substrate     │
│         during the cooling, and the upper surface of the metal substrate is │
│   formed as a curved surface protruding toward the connection substrate.    │
│  In addition, the lower surface of the metal substrate may be formed as a   │
│     curved surface protruding toward the connection substrate, an uneven    │
│                     surface or a surface of other shapes                    │
└─────────────────────────────────────────────────────────────┘
                                    │
                                    ▼
┌─────────────────────────────────────────────────────────────┐
│  Processing the lower surface of the metal substrate into a plane. When     │  S104
│    the lower surface of the metal substrate is formed as a curved surface   │
│       protruding toward the connection substrate, an uneven surface or a    │
│   surface of other shapes after the cooling, it can be processed as a plane │
│                    through a makeup processing procedure                    │
└─────────────────────────────────────────────────────────────┘
```

FIG. 3

```
┌─────────────────────────────────────────────────────────┐
│ Providing a power chip, a first bonding material, a     │
│ connection substrate, a second bonding material and a   │──S201
│ metal substrate, where an upper surface and a lower     │
│ surface of the metal substrate may be planes. But the   │
│ upper and lower surfaces of the metal substrate may     │
│ not be planes either, for example, the upper surface    │
│ can be a convex surface and the lower surface can be    │
│ a concave surface or a convex surface                   │
└─────────────────────────────────────────────────────────┘
                              │
                              ▼
┌─────────────────────────────────────────────────────────┐
│ Stacking the power chip, the first bonding material and │──S202
│ the connection substrate together in sequence and       │
│ heating them to 180°C ~ 350°C to obtain the connection  │
│ substrate connected with the power chip                 │
└─────────────────────────────────────────────────────────┘
                              │
                              ▼
┌─────────────────────────────────────────────────────────┐
│ Then stacking the connection substrate connected with   │
│ the power chip, the second bonding material and the     │──S203
│ metal substrate together in sequence and heating them   │
│ to 180°C ~ 350°C, where the second bonding material is  │
│ in contact with an upper surface of the metal substrate │
└─────────────────────────────────────────────────────────┘
                              │
                              ▼
┌─────────────────────────────────────────────────────────┐
│ Cooling the power chip, the first bonding material, the │
│ connection substrate, the second bonding material and   │
│ the metal substrate to -10°C ~ 40°C. A coefficient of   │
│ thermal expansion of the connection substrate is        │
│ smaller than a coefficient of thermal expansion of the  │──S204
│ metal substrate, and the upper surface and the lower    │
│ surface of the metal substrate are bendingly deformed   │
│ toward the connection substrate during the cooling,     │
│ and the upper surface of the metal substrate is formed  │
│ as a curved surface protruding toward the connection    │
│ substrate. In addition, the lower surface of the metal  │
│ substrate may be formed as a curved surface protruding  │
│ toward the connection substrate, an uneven surface or   │
│ a surface of other shapes after the cooling             │
└─────────────────────────────────────────────────────────┘
                              │
                              ▼
┌─────────────────────────────────────────────────────────┐
│ Processing the lower surface of the metal substrate     │──S205
│ into a plane. When the lower surface of the metal       │
│ substrate is formed as a curved surface protruding      │
│ toward the connection substrate, an uneven surface or   │
│ a surface of other shapes after the cooling, it can be  │
│ processed as a plane through a processing procedure     │
└─────────────────────────────────────────────────────────┘
```

FIG. 17

POWER MODULE AND PRODUCTION METHOD OF THE SAME

CROSS-REFERENCE TO RELATED APPLICATION

This application claims priority to Chinese Patent Application No. 201810178717.3, filed on Mar. 5, 2018, which is hereby incorporated by reference in its entirety.

TECHNICAL FIELD

The present disclosure relates to the technical field of electronic device encapsulation, and more particularly, to a power module and a production method of the same.

BACKGROUND

A power module is a common module in a power conversion circuit, and is used for implementing DC/DC conversion, AC/DC or DC/AC conversion, etc. The power module generally includes one or more power switching chips (also referred to as switches), and a controller, which is used for controlling turn-on and turn-off of the power switching chips to implement power conversion, is integrated inside or outside the power module.

Please refer to FIG. 1, which provides a schematic cross-sectional view of a power module before cooling in the prior art. The power module includes a power chip 1, a connection substrate 5 and a metal substrate 9, where the connection substrate 5 optionally includes an insulation body portion 52, an upper connection portion 51 located on an upper surface of the insulation body portion 52, and a lower connection portion 53 located on a lower surface of the insulation body portion 52. Specifically, a lower surface of the power chip 1 and the upper connection portion 51 of the connection substrate 5 are connected by a first solder 3', and the lower connection portion 53 of the connection substrate 5 and an upper surface of the metal substrate 9 are connected by a second solder 7'. During the production of the module, the power chip 1, the first solder 3', the connection substrate 5, the second solder 7', and the metal substrate 9 are stacked together in sequence; then the stacked module is heated to melt the first solder 3' and the second solder 7', so that the power chip 1, the connection substrate 5 and the metal substrate 9 are connected together; finally, a finished product can be obtained by cooling the soldered power module to room temperature.

However, during the temperature is cooled from high temperature to the room temperature, because a coefficient of thermal expansion (CTE) of the connection substrate 5 is generally less than 10 ppm/K and the CTE of a common metal substrate 9 (such as a copper plate) is about 17 ppm/K, a back surface of the power module will warp and a lower plane of the metal substrate 9 will protrude toward the connection substrate 5 under the influence of the mismatch of the coefficients of thermal expansion, thereby producing an adverse effect on the heat dissipation of the power module. Therefore, in the industry, a reverse pre-deformation as shown in FIG. 1 is often performed on the metal substrate 9, that is, a surface of the metal substrate 9 facing a heat sink (which is located below the metal substrate 9 but now shown) is formed into a slightly protruding form in advance, so that it is desired that the upper surface of the metal substrate 9 can be deformed into a plane as shown in FIG. 2 or a form that is slightly protruding toward the heat sink during the cooling from high temperature to room temperature to improve the heat dissipation effect of the power module.

In the above power module, since the metal substrate 9 adopts the reverse deformation technique, that is, the initial form is protruding toward the heat sink side, while the connection substrate 5 is approximately a plane, therefore, the thickness distribution of the second solder 7' between the metal substrate 9 and the connection substrate 5 is defined by the initial curved surface of the metal substrate 9 and the plane of the connection substrate 5, that is, in the prior art, the second solder 7' may be in a form with a thicker center and a thinner edge. Although the metal substrate 9 undergoes a certain bending deformation during the cooling from the high temperature to the low temperature, the degree of such bending deformation is technically difficult to be controlled, so that the second solder 7' between the metal substrate 9 and the connection substrate 5 of the soldered power module is limited by the processing technology of the reverse pre-deformation technique, and a situation where the center of the second solder is thicker and the edge of the second solder is thinner still exists. Since the edge of the solder is subject to relatively high thermal stress during the temperature cycle for the module, it is often where cracks are likely to occur at the earliest. Considering the influence on the heat transfer path of the chip when the solder cracks, the power chip 1 is generally disposed at a position around the middle of the connection substrate 5, and the corresponding solder thickness of the middle position of the connection substrate 5 is relatively larger, which increases the heat transfer resistance from the chip to the surface of the module, affecting the heat dissipation performance of the chip. It can be seen that, with the "thicker center and thinner edge" form of the solder as shown in the prior art, it is difficult to simultaneously satisfy the requirements of the reliability of temperature cycle and the heat dissipation of the chip. Moreover, the amount of deformation of the power module during the cooling from the high temperature to the room temperature cannot be accurately controlled in such a manner where the metal substrate 9 is pre-bended, which may result in unevenness of the lower surface of the metal substrate 9 as shown in FIG. 2. Therefore, in the prior art, a thickness of thermal grease between the metal substrate 9 and the heat sink is often increased to fill the uneven surface, thereby increasing the thermal resistance between the metal substrate 9 and the heat sink, which affects the heat dissipation effect.

SUMMARY

The present disclosure provides a power module and a production method of the same to address the above or other potential problems.

According to an embodiment of the present disclosure, a production method of a power module is provided, where the power module includes: a power chip, a connection substrate and a metal substrate, the power chip is disposed above the connection substrate and the metal substrate is disposed under the connection substrate, and the production method includes: a first step: providing the connection substrate, a second bonding material and the metal substrate; a second step: stacking the connection substrate, the second bonding material and the metal substrate together in sequence, and heating them to 180° C.~350° C. to obtain the connection substrate connected with the metal substrate, where the second bonding material is in contact with an upper surface of the metal substrate; a third step: cooling the connection substrate, the second bonding material and the metal substrate to a first temperature, where a coefficient of thermal expansion of the connection substrate is smaller than a coefficient of thermal expansion of the metal substrate and the upper surface and a lower surface of the metal surface are bendingly deformed toward the connection substrate during the cooling, the upper surface of the metal substrate is formed as a curved surface protruding toward the connection substrate, and the first temperature∈[−10° C., 40° C.]; a fourth step: processing the lower surface of the metal substrate into a plane.

According to another embodiment of the present disclosure, a power chip, a connection substrate and a metal substrate; a lower surface of the power chip is connected with an upper surface of the connection substrate by a first bonding material; a lower surface of the connection substrate is connected with an upper surface of the metal substrate by a second bonding material, and an average edge thickness of the second bonding material is greater than or equal to 0.8 times a center thickness of the second bonding material; the upper surface of the metal substrate is a curved surface protruding toward the connection substrate, and a lower surface of the metal surface is a plane in a first temperature∈[−10° C., 40° C.], where a coefficient of thermal expansion of the connection substrate is smaller than a coefficient of thermal expansion of the metal substrate.

In the power module and production method of the same provided by the present disclosure, in the cooling process after the high temperature bonding, the upper surface of the metal substrate may be formed as a curved surface protruding toward the connection substrate. Compared with the disadvantage that the center of the second solder is thicker and the edge of the second solder is thinner because that the metal substrate is firstly pre-bent in the prior art, in the power module and the production method of the same of the disclosure, the second bonding material located between the metal substrate and the connection substrate has a larger edge thickness than the edge thickness of the second solder in the power module produced according to the prior art, which reduces the thermal stress that the edge of the second bonding material is subject to, thereby improving the reliability of the power module while the power module has good heat dissipation performance. At the same time, by makeup processing of the lower surface of the metal substrate, thermal degradation of the power module caused by unevenness of the lower surface can be avoided.

The advantages of the additional aspects of the present disclosure will be partly set forth in the following description, the part will become apparent from the description below, or will be known from the practice of the present disclosure.

BRIEF DESCRIPTION OF DRAWINGS

The above and other objects, features and advantages of embodiments of the present disclosure will become more readily understood from the following detailed description with reference to the accompanying drawings. Referring to the accompanying drawings, the embodiments of the present disclosure will be described by way of example and in a non-limiting manner.

FIG. 3 is a schematic flowchart diagram of a production method of a power module according to Embodiment 1 of the present disclosure;

FIG. 17 is a flowchart diagram of a production method of a power module according to Embodiment 2 of the present disclosure;

In the drawings, where

Figure 1:
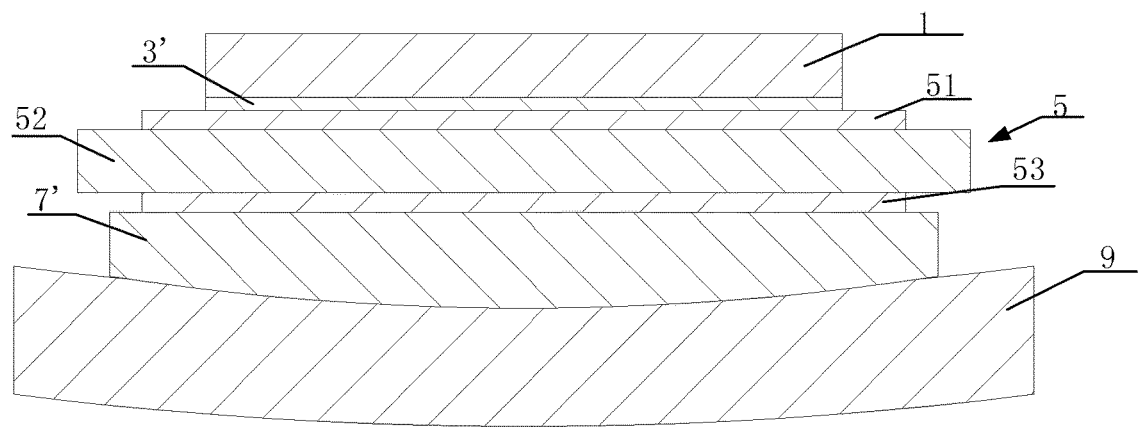
FIG. 1 is a schematic structural diagram of a power module before cooling in the prior art.
Figure 2:
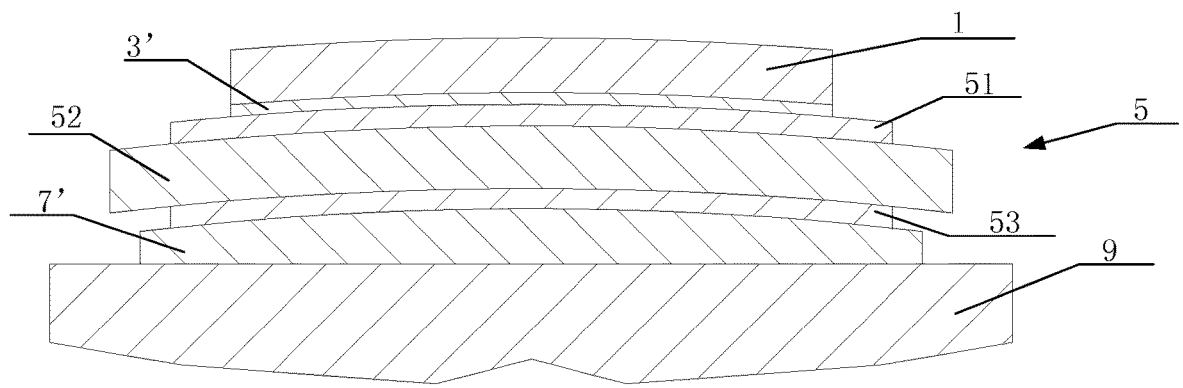
FIG. 2 is a schematic structural diagram of the power module in FIG. 1 after cooling.

| 1: power chip; | 3: first bonding material; |
| 3': first solder; | 5: connection substrate; |
| 51: upper connection portion; | 52: insulation body portion; |
| 53: lower connection portion; | 7: second bonding material; |
| 7': second solder | 9: metal substrate. |

DESCRIPTION OF EMBODIMENTS

The embodiments of the present disclosure are described in detail below, and the examples of the embodiments are illustrated with reference to the accompanying drawings, where the same or similar reference numerals refer to the same or similar elements or elements having the same or similar functions throughout the description. The embodiments described below with reference to accompanying drawings are exemplary and intended to be used to explain the disclosure and cannot to be construed as limitations to the present disclosure.

In the description of the present disclosure, it is to be understood that the orientations or positional relationships indicated by terms "longitudinal", "transverse", "length", "width", "thickness", "upper", "lower", and the like are based on the orientations or positional relationships shown in accompanying drawings, and they are only for the convenience of describing the present disclosure and simplifying the description instead of indicating or implying that the unit or component referred to must have a specific orientation or is constructed and operated in a specific orientation, therefore, they cannot be construed as limitations to the present disclosure.

Moreover, the terms "first" and "second" are merely used for description purposes and are not to be construed as indicating or implying a relative importance or implicitly pointing out the number of indicated technical features. Thus, features defined by "first" or "second" may include at least one of the features, either explicitly or implicitly. In the description of the present disclosure, unless specifically defined otherwise, the meaning of "a plurality" is at least two, such as two, three and the like.

Embodiment 1

Figure 4:
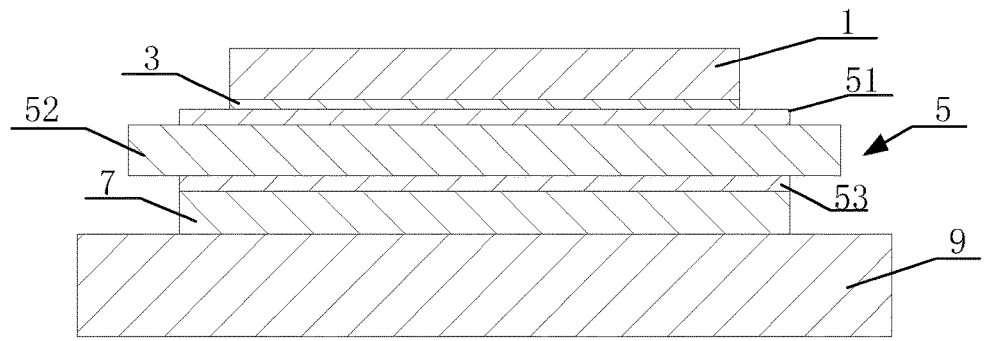
FIG. 4 is a schematic structural diagram of a first power module before cooling according to Embodiments 1 to 5 of the present disclosure.

FIG. 3 is a flowchart diagram of a production method of a power module according to this embodiment; FIG. 4 is a schematic structural diagram of a power module before cooling according to this embodiment. Referring to FIG. 3 and FIG. 4, the production method of the power module of this embodiment includes:

S101: Providing a power chip, a first bonding material, a connection substrate, a second bonding material, and a metal substrate, where an upper surface and a lower surface of the metal substrate may be planes. But the upper and lower surfaces of the metal substrate may not be planes either, for example, the upper surface can be a convex surface and the lower surface can be a concave surface or a convex surface.

Specifically, the power chip 1 may be any power chip used in the prior art, such as MOSFET, IGBT, SiC MOSFET, GaN HEMT and the like. The power chip 1 generally has three ports, for example, a MOSFET has two power electrodes (drain and source) and one control electrode (gate), an IGBT has two power electrodes (collector and emitter) and one control electrode (gate), but the present disclosure is not limited thereto. The power chip 1 can be a vertical or horizontal structure. When the vertical structure is adopted, a power electrode is integrated on each of a front side and a back side of the chip, and the control electrode is generally disposed on the front side of the chip. Taking MOSFET as an example, it is common that the source and the gate are disposed on the front side of the chip, and its bonding pad is generally a metallization layer of aluminum or aluminum alloy; a drain is disposed on the back side of the chip and it is generally processed into a solderable metallization surface. The back side of the power chip 1 can be connected to the connection substrate 5 by the first bonding material 3, and the electrode(s) on the front side of the power chip 1 is generally connected to a wiring layer of the connection substrate 5 by a wire bonding technology.

The first bonding material 3 may be any solder or sintering material (for example, sintering silver or sintering copper, etc.) used in the prior art by which a mechanical and thermal connection between the power chip 1 and the connection substrate 5 can be achieved.

The connection substrate 5 may be a DBC (Direct Bonding Copper) substrate, a DBA (Direct Bonding Aluminum) substrate, an AMB (Active Metal Bonding) substrate, a thick film metallization ceramic plate, an LTCC (Low Temperature Co-fired Ceramic) substrate, an IMS (Insulated Metal Substrate) substrate, a PCB (Printed Circuit Board), etc.

A connection between the connection substrate 5 and the metal substrate 9 can be achieved by the second bonding material 7. Of course, in actual use, a person skilled in the art can select a suitable bonding material according to an expected heating temperature, or a person skilled in the art can also determine a suitable heating temperature according to a selected bonding material, and in this embodiment, the second bonding material 7 and the first bonding material 3 may be made of a same material or different materials. For example, the first bonding material 3 and the second bonding material 7 may be any one of a solder, a sintering material and an adhesive material.

The metal substrate 9 may be a copper substrate or a substrate made of copper alloy. The metal substrate 9 made of the above two materials has good processability, but a metal substrate 9 made of other materials is not excluded in this embodiment either. It should be emphasized that no pre-bending operation is performed on the metal substrate 9 in this embodiment, for example, the metal substrate 9 used in this embodiment may be a metal substrate in a plane form with both its upper and lower surfaces being planes, as shown in FIG. 4.

The metal substrate 9 may be made of a ceramic-metal composite material such as an aluminum-silicon carbide composite material. In other words, a ceramic-metal composite substrate made of a ceramic-metal composite material is used as the metal substrate 9. Taking the aluminum-silicon carbide composite material as an example: since the difference in the coefficients of thermal expansion between the aluminum silicon carbide material and the connection substrate 5 is relatively small (the CTE of the metal substrate 9 is still larger than the CTE of the connection substrate 5), the reliability of the temperature cycle of the module can be further improved, but the processability of the aluminum silicon carbide material is extremely poor. In this case, aluminum of a certain thickness can be settled on a surface of the aluminum silicon carbide substrate to be processed, thereby forming an aluminum-silicon carbide composite substrate to satisfy the machinability requirement.

S102: Stacking the power chip, the first bonding material, the connection substrate, the second bonding material, and the metal substrate together in sequence and heating them to 180° C.~350° C., where the second bonding material is in contact with the upper surface of the metal substrate.

Specifically, in some implementations, the first bonding material 3 and the second bonding material 7 will be melted into liquid form after they are heated to 180° C.~350° C., thereby mechanically connecting the power chip 1, the connection substrate 5, and the metal substrate 9 together. For example, when the first bonding material 3 and the second bonding material 7 are both made of solder, both of them are melted into liquid at a temperature of 180° C.~350° C. to implement the connection among the power chip 1, the connection substrate 5 and the metal substrate 9.

In other implementations, the first bonding material 3 and the second bonding material 7 will not be melted into liquid form after they are heated to 180° C.~350° C., instead, the power chip 1, the connection substrate 5 and the metal substrate 9 are connected together when the first bonding material 3 and the second bonding material 7 are in solid form. For example, when the first bonding material 3 and the second bonding material 7 are both made of sintering silver, they can mechanically connect the power chip 1, the connection substrate 5 and the metal substrate 9 without being melted into liquid form.

It can be understood that in other implementations, one of the first bonding material 3 and the second bonding material 7 may be melted into liquid form with the other being still in solid form after they are heated to a temperature of 180° C.~350° C.

S103: Cooling the power chip, the first bonding material, the connection substrate, the second bonding material and the metal substrate to −10° C.~40° C. A coefficient of thermal expansion of the connection substrate is smaller than a coefficient of thermal expansion of the metal substrate, and the upper surface and the lower surface of the metal substrate are bendingly deformed toward the connection substrate during the cooling, and the upper surface of the metal substrate is formed as a curved surface protruding toward the connection substrate. In addition, the lower surface of the metal substrate may be formed as a curved surface protruding toward the connection substrate, an uneven surface or a surface of other shapes.

The thickness distribution of the second bonding material 7 is determined by the positional relationship between the upper surface of the metal substrate 9 and the lower surface of the connection substrate 5 under a high temperature state, and the thickness distribution of the second bonding material 7 is substantially unchanged during the subsequent cooling process. Therefore, when the two surfaces are both planes, the average edge thickness of the second bonding material 7 is greater than or equal to 0.8 times the center thickness of the second bonding material 7 after the module is cooled from high temperature.

Specifically, when the first bonding material 3 and the second bonding material 7 are cooled to −10° C.~−40° C., the first bonding material 3 mechanically connects the power chip 1 and the connection substrate 5, and the second bonding material 7 mechanically connects the connection substrate 5 and the metal substrate 9. The cooling may be, for example, natural cooling, but additional manners may be used to accelerate the cooling rate, and a plurality times of heating and cooling may also be performed, and the present disclosure is not limited to the above manners.

Figure 5:
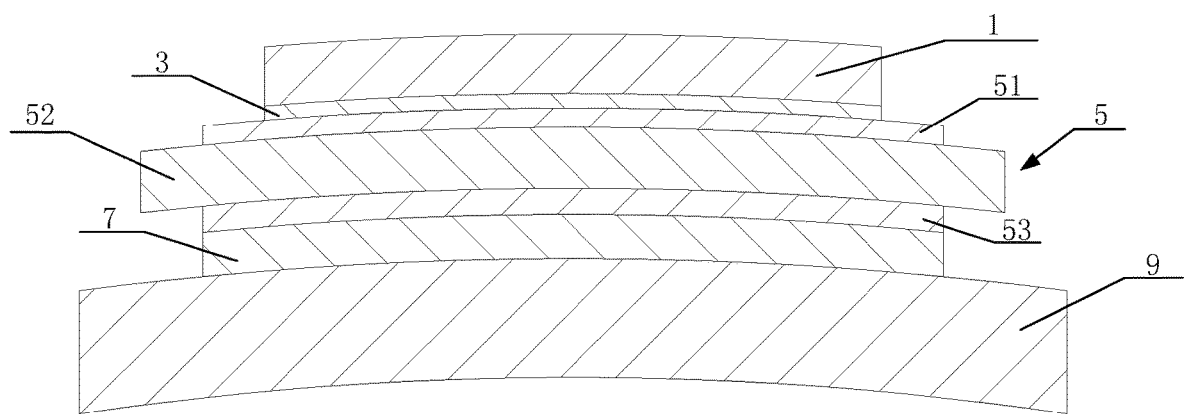
FIG. 5 is a schematic structural diagram of the power module in FIG. 4 after cooling.

Meanwhile, during the cooling process, since the coefficient of thermal expansion (CTE) of the connection substrate 5 is relatively small, for example, generally less than 10 ppm/K, and the CTE of the metal substrate 9 is relatively large, for example, about 17 ppm/K. Therefore, when the power module is cooled from a high temperature of 180° C.~350° C. to a low temperature of −10° C.~−40° C., the shrinkage of the metal substrate 9 is greater than the shrinkage of the connection substrate 5, so that the power module is deformed into a shape as shown in FIG. 5 when the temperature is lowered to −10° C.~−40° C. FIG. 5 is a schematic structural diagram of the power module after cooling according to this embodiment. Optionally, after cooling to −10° C.~−40° C., the average edge thickness of the second bonding material 7 is greater than or equal to 0.8 times the center thickness of the second bonding material 7, and in the prior art, the edge thickness of the second solder 7' is generally much smaller than the center thickness thereof; preferably, the average edge thickness of the second bonding material 7 is greater than or equal to the center thickness of the second bonding material 7. A bonding material with a thicker edge has a good effect on improving the reliability of the temperature cycle.

S104: Processing the lower surface of the metal substrate into a plane. When the lower surface of the metal substrate is formed as a curved surface protruding toward the connection substrate, an uneven surface or a surface of other shapes after the cooling, it can be processed as a plane through a makeup processing procedure.

Figure 6:
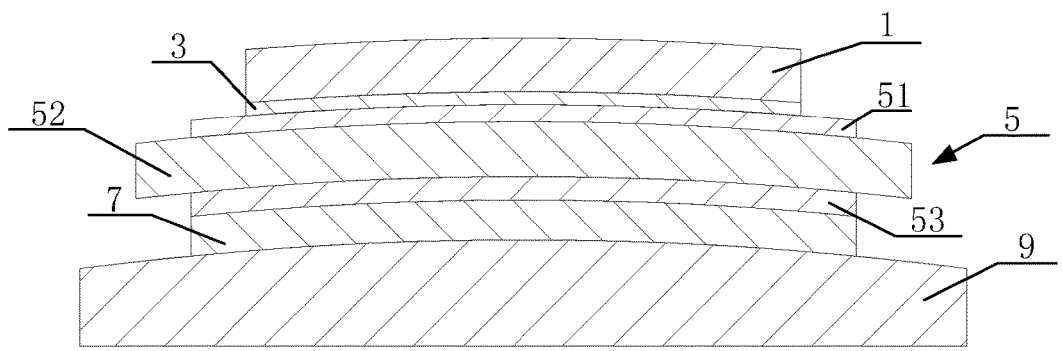
FIG. 6 is a schematic structural diagram after a lower surface of a metal substrate of the power module in FIG. 5 being processed into a plane.

Specifically, the method for processing the lower surface of the metal substrate 9 into a plane may be any processing method, for example, the curved lower surface of the metal substrate 9 may be processed into a plane as shown in FIG. 6 by milling through a machine tool or grinding through a grinder. FIG. 6 is a schematic structural diagram of the lower surface of the power module in FIG. 5 after being processed into a plane. Compared with other processing such as curved surface processing, plane processing has significant advantages such as being easy for investment on equipment and high production efficiency. Further, the process for processing the lower surface of the metal substrate 9 into a plane may be divided into several processes along the thickness direction to overcome the warp caused by the increase or decrease of the material after a single process. By means of dividing the process into several processes, step-by-step, each warp caused by the previous process would be eliminated by the subsequent process. Further, during the processing the lower surface of the metal substrate 9 into a plane, the amount of processing may be reduced by constraining the metal substrate (such as fixing the position of the hole via which the metal substrate and the heat sink are assembled to a plane or even a curved surface), which is especially beneficial for some large size modules. Since the lower surface of the metal substrate 9 is processed into a plane, when it is mounted on the heat sink, the thickness of the thermal grease used between the metal substrate 9 and the heat sink can be reduced, thereby reducing the thermal resistance between the metal substrate 9 and the heat sink and improving the heat dissipation efficiency.

Figure 7:
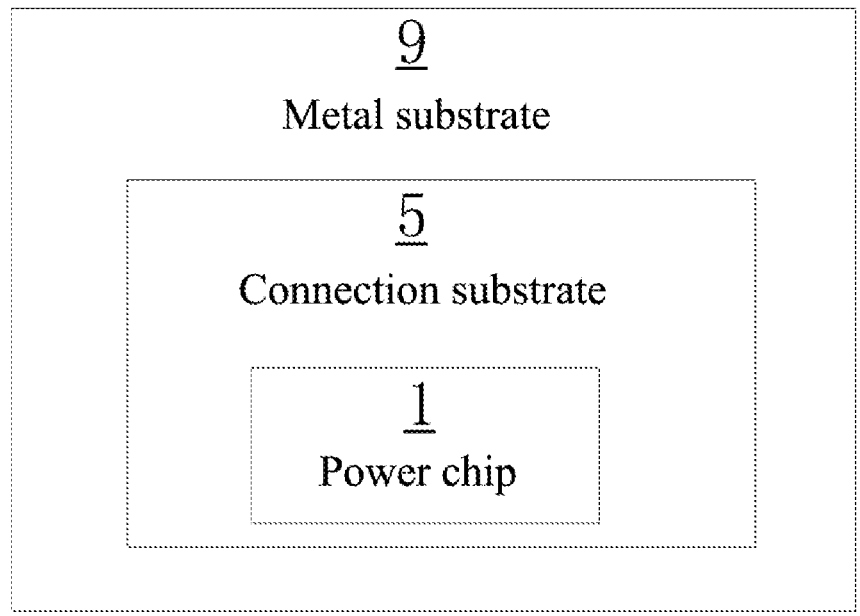
FIG. 7 to FIG. 11 are top views of several power modules whose power chips having different arrangements according to Embodiments 1 to 5 of the present disclosure.
Figure 8:
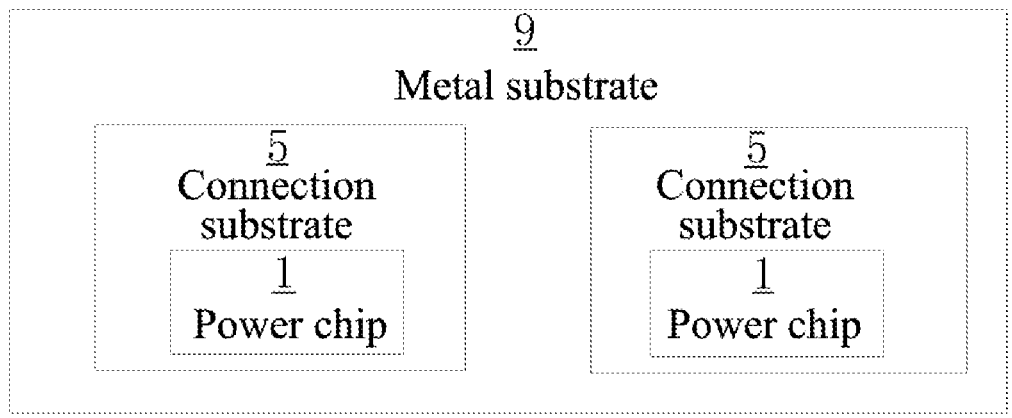
Figure 9:
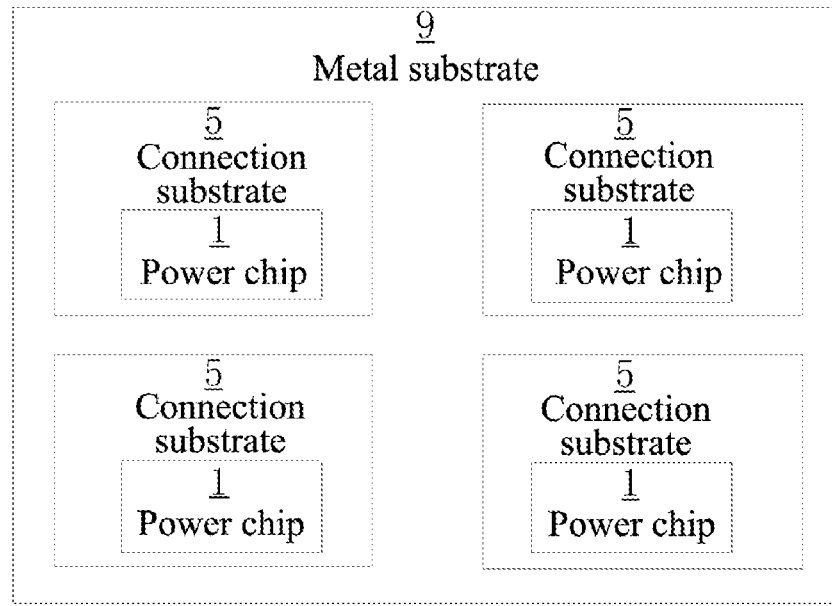

Further, in various embodiments of the present disclosure, the number of power chips 1 may be one or more. For example, in the top view of the power module as shown in FIG. 7, there is only one power chip 1 arranged on the connection substrate 5. For another example, in the top view of the power module as shown in FIG. 8, there are two power chips 1 arranged laterally on the connection substrate 5. For yet another example, in the top view of the power module as shown in FIG. 9, there are four power chips 1 arranged laterally and longitudinally on the connection substrate 5.

Figure 10:
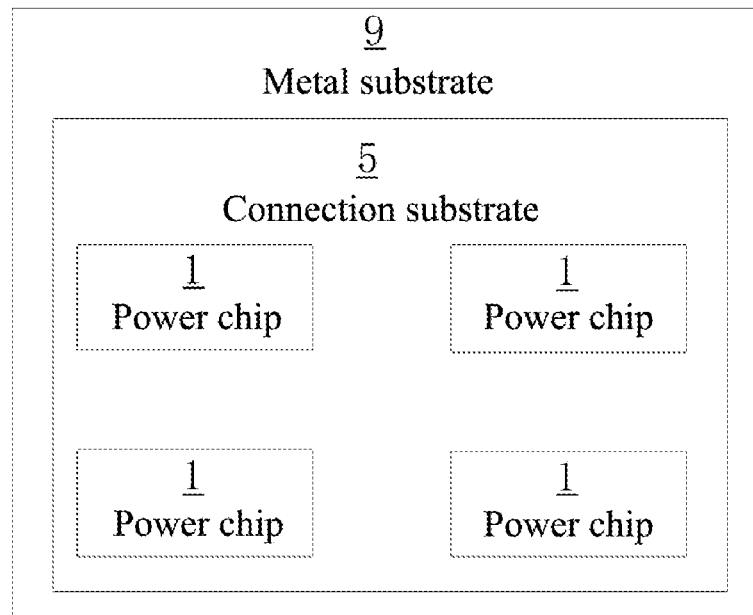
Figure 11:
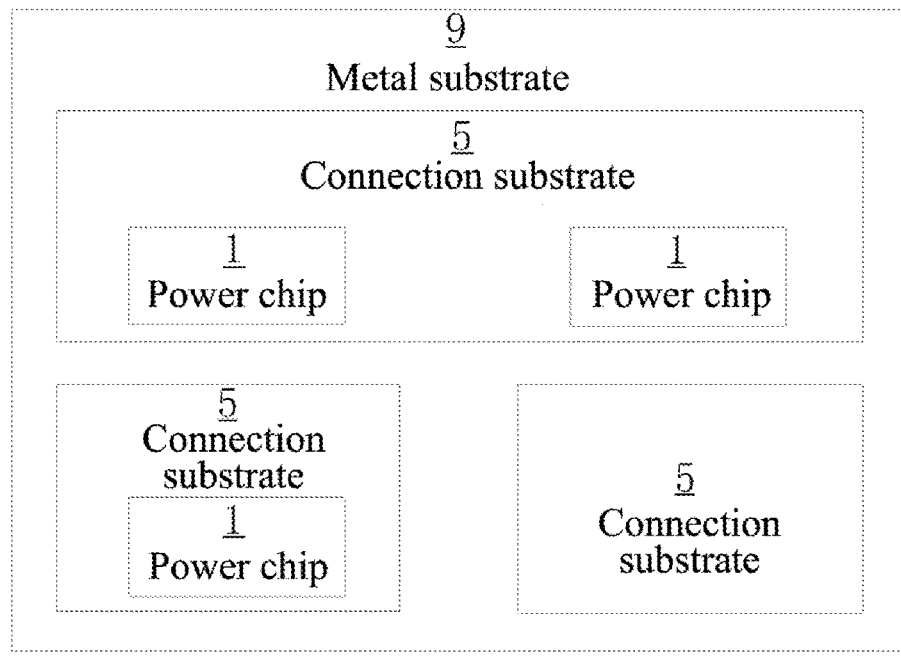

It can be understood that when the number of the power chips 1 is plural, the number of the first bonding materials 3 is also plural, and the number of the connection substrates 5 and the number of the second bonding materials 7 may be one or more. For example, when each of the number of the connection substrate 5, the number of the second bonding material 7 and the number of the metal substrate 9 is one, the plurality of power chips 1 respectively correspond to the plurality of first bonding materials 3 and are stacked together in sequence with one connection substrate 5, one second bonding material 7 and one metal substrate 9, as shown in FIG. 10. For another example, when the number of the metal substrates 9 is one and each of the number of the connection substrate 5, the number of the second bonding material 7, the number of the power chip 1 and the number of the first bonding material 3 is plural, the plurality of power chips 1 and the plurality of first bonding materials 3 are correspondingly stacked on the plurality of connection substrates 5, and the plurality of connection substrates 5 and the plurality of second bonding materials 7 are correspondingly stacked on one metal substrate 9, as shown in FIG. 8, FIG. 9 and FIG. 11. Specifically, a plurality of power chips 1 and their corresponding first bonding materials 3 may be stacked on one of the connection substrates 5, where there is a power chip 1 stacked on each connection substrate 5, or there may be no power chip 1 stacked on one or some of the connection substrates 5, as shown in FIG. 11. Also, when the number of the power chip 1, the number of the first bonding material 3, the number of the connection substrate 5 and the number of the second bonding material 7 are the same, one power chip 1 corresponds to one first bonding material 3, one connection substrate 5 and one second bonding material 7, and they are stacked together in sequence and then stacked on one metal substrate 9, as shown in FIG. 8 and FIG. 9. The arrangement of the connection substrate 5 can be multiple manners such as a straight line-shape or a matrix-shape, and the present disclosure is not limited thereto.

Figure 12:
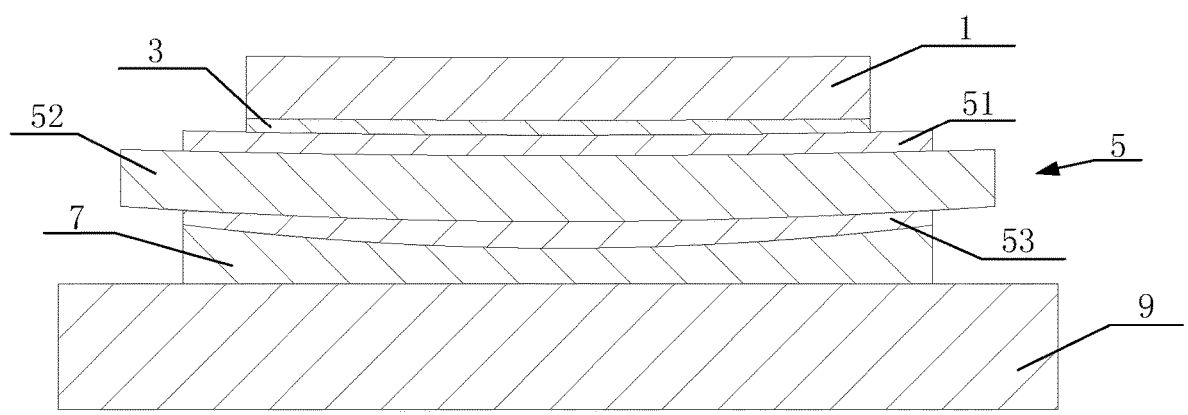
FIG. 12 is a schematic structural diagram of a second power module before cooling according to Embodiments 1 to 5 of the present disclosure.
Figure 13:
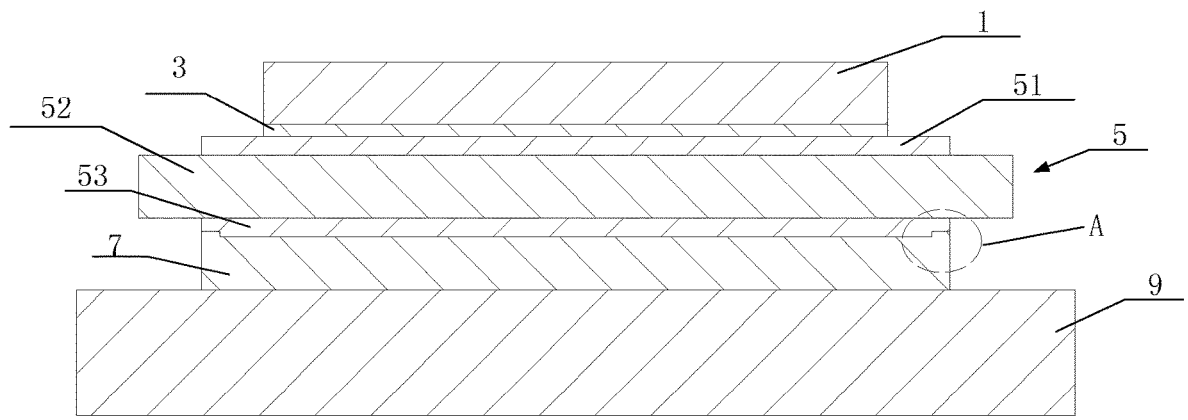
FIG. 13 is a schematic structural diagram of a third power module before cooling according to Embodiments 1 to 5 of the present disclosure.
Figure 14:
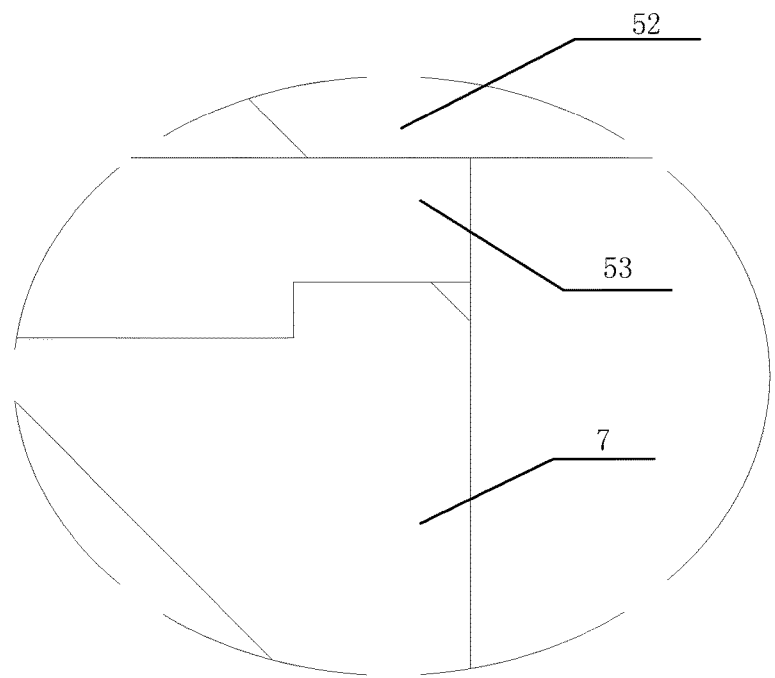
FIG. 14 is a partial enlarged diagram of a portion A in FIG. 13.
Figure 15:
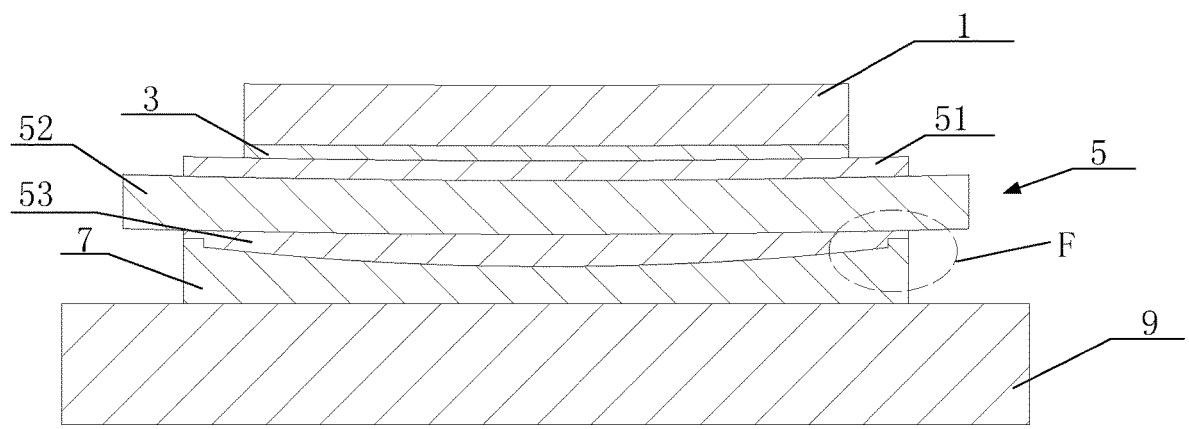
FIG. 15 is a schematic structural diagram of a fourth power module before cooling according to Embodiments 1 to 5 of the present disclosure.
Figure 16:
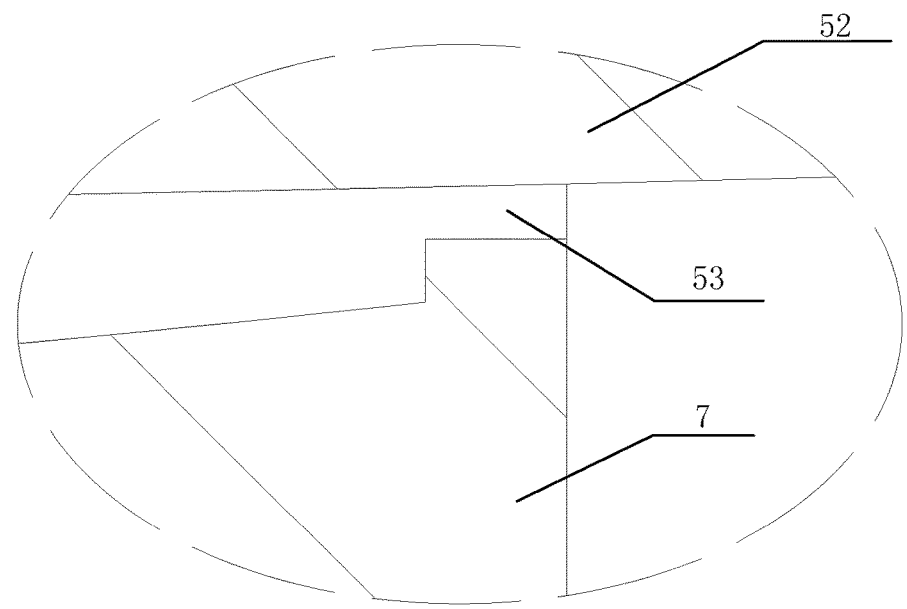
FIG. 16 is a partial enlarged diagram of a portion F in FIG. 15.

Continuously referring to FIG. 4, the connection substrate 5 optionally includes an insulation body portion 52, an upper connection portion 51 located on an upper surface of the insulation body portion 52, and a lower connection portion 53 located on a lower surface of the insulation body portion 52. Where, before the heating step, the lower surface of the lower connection portion 53 may be a plane as shown in FIG. 4 or a curved surface protruding toward the metal substrate 9 as shown in FIG. 12, that is, the thickness of lower connection portion 53 may be uniform or non-uniform, and the present disclosure is not limited thereto. In order to increase the edge thickness of the second bonding material 7, a part of the edge of the lower connection portion 53 may be removed, as shown in FIG. 13 to FIG. 16, so that the edge thickness of the lower connection portion 53 is further smaller than the center thickness of the lower connection portion 53, so as to enable the edge part of the lower connection portion 53 to accommodate more second bonding material 7, rendering the edge thickness of the second bonding material 7 being relatively large after cooling to −10° C.~40° C., thereby improving the stability of the power module. In this case, the lower connection portion 53 is generally not uniform in thickness. FIG. 13 is a schematic structural diagram of the power module after a part of the edge of the lower connection portion in FIG. 4 being removed. FIG. 14 is a partial enlarged diagram of a part A in FIG. 13; FIG. 15 is a schematic structural diagram of a power module after a part of the edge of the lower connection portion in FIG. 12 being removed; FIG. 16 is a partial enlarged diagram of a part F in FIG. 15.

According to the power module and the production method of the same according to this embodiment, a metal substrate 9 is connected with the connection substrate 5 in a high temperature, and in the process of cooling from a high temperature to a low temperature, the upper surface and the lower surface of the metal substrate 9 are bendingly deformed toward the connection substrate 5, and the upper surface of the metal substrate 9 is formed as a curved surface protruding toward the connection substrate 5. Compared with the power module produced according to the prior art, the second bonding material 7 between the connection substrate 5 and the metal substrate 9 has a greater average edge thickness than that of the second solder 7', which reduces the thermal stress that the edge of the second bonding material 7 is subject to, thereby improving the reliability of the power module during temperature cycle. Of course, if the lower surface of the lower connection portion 53 of the connection substrate 5 is provided as a curved surface protruding toward the metal substrate 9 and/or a part of the edge of the lower connection portion 53 is removed, the average edge thickness of the second bonding material 7 can be further increased to improve the reliability of the power module.

According to the power module and the production method of the same according to this embodiment, the thickness of the thermal grease required to be filled between the lower surface of the metal substrate 9 and the heat sink, when the power module is mounted on the heat sink, can be reduced by processing the lower surface of the metal substrate 9 formed as a curved surface into a plane, thereby reducing the thermal resistance between the power module and the heat sink and improving the heat dissipation efficiency of the power module.

In addition, in the power module and the production method of the same according to this embodiment, there's no need to perform pre-bending on the metal substrate 9, therefore, the controllability of the process precision is better, the production cost of the power module can be reduced, and the production time is reduced, thereby improving the production efficiency.

Embodiment 2

FIG. 17 is a flowchart diagram of a production method of a power module according to the embodiment. As shown in FIG. 17, the production method of the power module according to this embodiment includes:

S201: Providing a power chip, a first bonding material, a connection substrate, a second bonding material and a metal substrate, where an upper surface and a lower surface of the metal substrate may be planes. But the upper and lower surfaces of the metal substrate may not be planes either, for example, the upper surface can be a convex surface and the lower surface can be a concave surface or a convex surface.

This step is the same as step S101 in Embodiment 1. Please refer to the description in Embodiment 1.

S202: Stacking the power chip, the first bonding material and the connection substrate together in sequence and heating them to 180° C.~350° C. to obtain the connection substrate connected with the power chip.

Specifically, in some implementations, the first bonding material 3 will be melted into liquid form after it is heated to 180° C.~350° C., thereby connecting the power chip 1 and the connection substrate 5 together. For example, when the first bonding material 3 is made of solder, it is melted into liquid at a temperature of 180° C.~350° C. to implement the connection between the power chip 1 and the connection substrate 5.

In other implementations, the first bonding material 3 will not be melted into liquid form after it is heated to 180° C.~350° C., instead, the first bonding material 3 connects the power chip 1 and the connection substrate 5 are together when it is in solid form. For example, when the first bonding material 3 is made of sintering silver, it can connect the power chip 1 and the connection substrate 5 without being melted into liquid form.

S203: Then stacking the connection substrate connected with the power chip, the second bonding material and the metal substrate together in sequence and heating them to 180° C.~350° C., where the second bonding material is in contact with an upper surface of the metal substrate.

Specifically, after the power chip 1 and the connection substrate 5 are connected together by the first bonding material 3, the connection substrate 5 connected with the power chip 1, the second bonding material 7 and the metal substrate 9 may be stacked in sequence for subsequent operations. In actual practice, the connection substrate 5 connected with the power chip 1 may be first cooled to a certain temperature (for example, −10° C.~40° C.) to facilitate stacking the connection substrate 5 connected with the power chip 1 together with the second bonding material 7 and the metal substrates 9, but the connection substrate 5 connected with the power chip 1, the second bonding material 7 and the metal substrate 9 may be also directly stacked together without cooling.

Similar to the first bonding material 3, in some implementations, when the second bonding material 7 is heated to 180° C.~350° C., it will also be melted into the liquid form, thereby connecting the connection substrate 5 connected with the power chip 1 and the metal substrate 9 together. For example, when the second bonding material 7 is solder, it is melted into the liquid form at a temperature of 180° C.~350° C. to implement the connection between the connection substrate 5 connected with the power chip 1 and the metal substrate 9.

In other implementations, when the second bonding material 7 is heated to 180° C.~350° C., it will not be melted into the liquid form, instead, it connects the connection substrate 5 connected with the power chip 1 and the substrates 9 together in the solid form. For example, when the second bonding material 7 is made of sintering silver, it can connect the connection substrate 5 connected with the power chip 1 and the metal substrate 9 without being melted into the liquid form.

It should be noted that in this embodiment, after the first bonding material 3 and the second bonding material 7 are heated to a temperature of 180° C.~350° C., one of them may be melted into the liquid form while the other is still in the solid form. And when the first bonding material 3 and the second bonding material 7 are both melted into the liquid form at the bonding temperature, it is preferable that the melting point of the first bonding material 3 is higher than the melting point of the second bonding material 7 to prevent remelting of the first bonding material 3. The heating temperature of this step is lower than the heating temperature of step S202. Specifically, when the material of the first bonding material 3 is different from the material of the second bonding material 7, the first bonding material 3 can be heated at a higher temperature in the range of 180° C.~350° C., for example, 300° C., and the second bonding material 7 can be heated at a lower temperature in the range of 180° C.~350° C., for example, 200° C. Then, when the connection substrate 5 connected with the power chip 1 and the metal substrate 9 are connected together, the first bonding material 3 may not be remelted, but the present disclosure is not limited thereto.

S204: Cooling the power chip, the first bonding material, the connection substrate, the second bonding material and the metal substrate to −10° C.~40° C. A coefficient of thermal expansion of the connection substrate is smaller than a coefficient of thermal expansion of the metal substrate, and the upper surface and the lower surface of the metal substrate are bendingly deformed toward the connection substrate during the cooling, and the upper surface of the metal substrate is formed as a curved surface protruding toward the connection substrate. In addition, the lower surface of the metal substrate may be formed as a curved surface protruding toward the connection substrate, an uneven surface or a surface of other shapes after the cooling.

This step is the same as step S103 in Embodiment 1. Please refer to the description in Embodiment 1.

S205: Processing the lower surface of the metal substrate into a plane. When the lower surface of the metal substrate is formed as a curved surface protruding toward the connection substrate, an uneven surface or a surface of other shapes after the cooling, it can be processed as a plane through a processing procedure.

This step is the same as step S104 in Embodiment 1. Please refer to the description in Embodiment 1.

Further, in this embodiment, the number of the power chip 1 may be one or more, and the structure thereof may be the same as that of Embodiment 1. For details, please refer to the description in Embodiment 1.

Further, in this embodiment, the connection substrate 5 may include an insulation body portion 52, an upper connection portion 51 located on the upper surface of the insulation body portion 52, and a lower connection portion 53 located on the lower surface of the insulation body portion 52. The other structures of the connection substrate 5 are the same as those of Embodiment 1. For details, please refer to the description in Embodiment 1.

According to the power module and the production method of the same according to this embodiment, the metal substrate 9 is connected with the connection substrate 5 in a high temperature, and in the process of cooling from a high temperature to a low temperature, the upper surface and the lower surface of the metal substrate 9 are bendingly deformed toward the connection substrate 5, and the upper surface of the metal substrate 9 is formed as a curved surface protruding toward the connection substrate 5. Compared with the power module produced according to the prior art, the second bonding material 7 between the connection substrate 5 and the metal substrate 9 has a greater average edge thickness than that of the second solder 7', which reduces the thermal stress that the edge of the second bonding material 7 is subject to, thereby improving the reliability of the power module during temperature cycle. Of course, if the lower surface of the lower connection portion 53 of the connection substrate 5 is provided as a curved surface protruding toward the metal substrate 9 and/or a part of the edge of the lower connection portion 53 is removed, the average edge thickness of the second bonding material 7 can be further increased to improve the reliability of the power module.

According to the power module and the production method of the same according to this embodiment, the thickness of the thermal grease required to be filled between the lower surface of the metal substrate 9 and the heat sink, when the power module is mounted on the heat sink, can also be reduced by processing the lower surface of the metal substrate 9 formed as a curved surface into a plane, thereby reducing the thermal resistance between the power module and the heat sink and improving the heat dissipation efficiency of the power module.

In addition, in the power module and the production method of the same according to this embodiment, there's no need to perform pre-bending on the metal substrate 9, therefore, the controllability of the process precision is better, the production cost of the power module can be reduced, and the production time is reduced, thereby improving the production efficiency.

Embodiment 3

Figure 18:
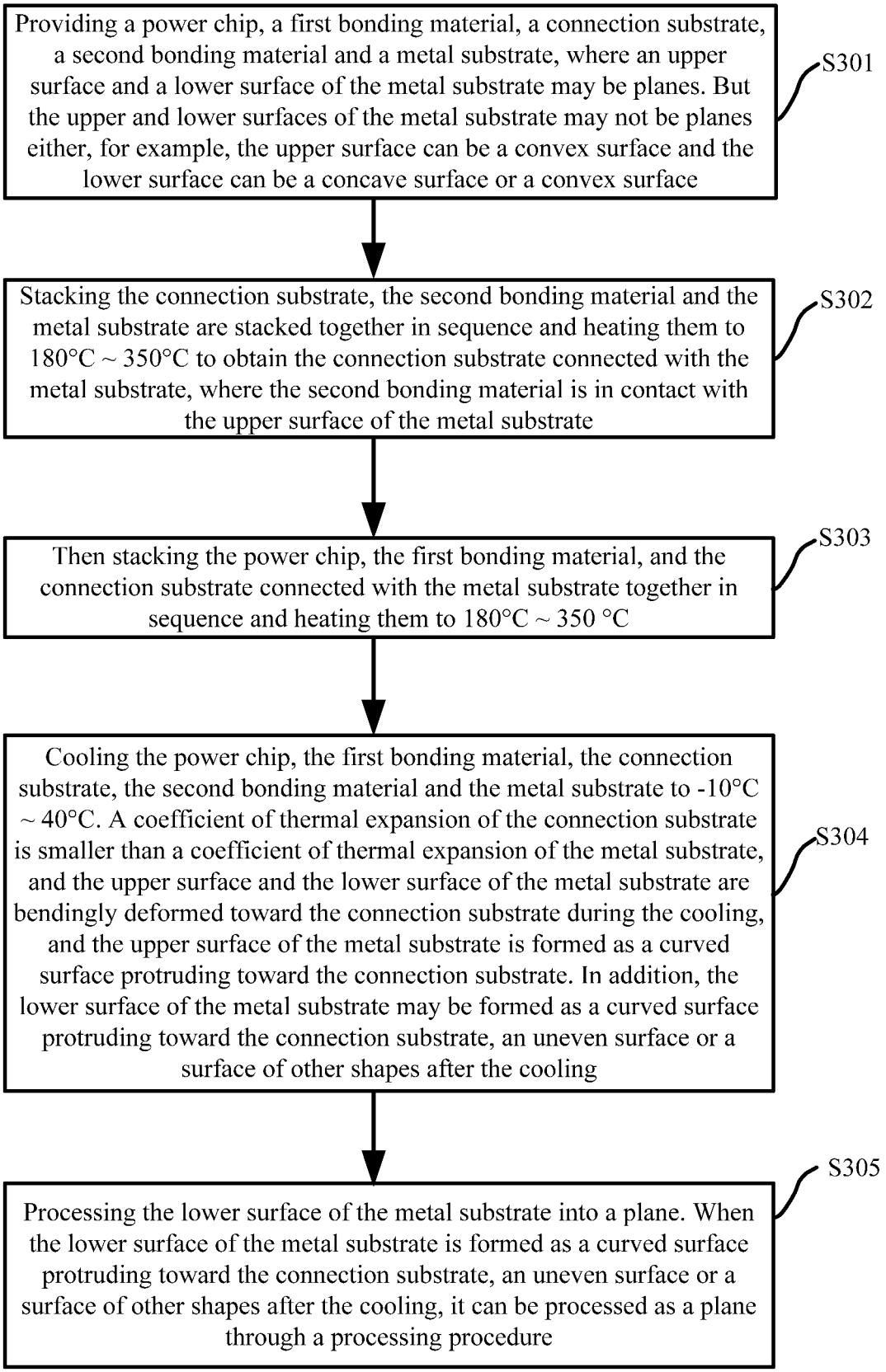
FIG. 18 is a flowchart diagram of a production method of a power module according to Embodiment 3 of the present disclosure.

FIG. 18 is a flowchart diagram of a production method of a power module according to this embodiment. As shown in FIG. 18, the production method of the power module of this embodiment includes:

S301: Providing a power chip, a first bonding material, a connection substrate, a second bonding material and a metal substrate, where an upper surface and a lower surface of the metal substrate may be planes. But the upper and lower surfaces of the metal substrate may not be planes either, for example, the upper surface can be a convex surface and the lower surface can be a concave surface or a convex surface.

This step is the same as step S101 in Embodiment 1. Please refer to the description in Embodiment 1.

S302: Stacking the connection substrate, the second bonding material and the metal substrate are stacked together in sequence and heating them to 180° C.~350° C. to obtain the connection substrate connected with the metal substrate, where the second bonding material is in contact with the upper surface of the metal substrate.

Specifically, in some implementations, the second bonding material 7 will be melted into liquid form after it is heated to 180° C.~350° C., thereby connecting the connection substrate 5 and the metal substrate 9 together. For example, when the second bonding material 7 is made of solder, it is melted into liquid at a temperature of 180° C.~350° C. to implement the connection between the connection substrate 5 and the metal substrate 9.

In other implementations, the second bonding material 7 will not be melted into liquid form after it is heated to 180° C.~350° C., instead, the second bonding material 7 connects the connection substrate 5 and the metal substrate 9 together when it is in solid form. For example, when the second bonding material 7 is made of sintering silver, it can connect the connection substrate 5 and the metal substrate 9 without being melted into the liquid form.

S303: Then stacking the power chip, the first bonding material, and the connection substrate connected with the metal substrate together in sequence and heating them to 180° C.~350° C.

Specifically, after the connection substrate 5 and the metal substrate 9 are connected together by the second bonding material 7, the power chip 1, the first bonding material 3 and the connection substrate 5 connected with the metal substrate 9 may be stacked in sequence for subsequent operations. In actual practice, the connection substrate 5 connected with the metal substrate 9 may be first cooled to a certain temperature (for example, −10° C.~40° C.) to facilitate stacking the power chip 1, the first bonding material 3 and the connection substrate 5 connected with the metal substrate 9 together, but the power chip 1, the first bonding material 3 and the connection substrate 5 connected with the metal substrate 9 may also be directly stacked together without cooling.

Similar to the second bonding material 7, in some implementations, when the first bonding material 3 is heated to 180° C.~350° C., it will also be melted into the liquid form, thereby connecting the power chip 1 and the connection substrate 5 connected with the metal substrate 9 together. For example, when the first bonding material 3 is made of solder, it is melted into liquid form at a temperature of 180° C.~350° C. to implement connection between the power chip 1 and the connection substrate 5 connected with the metal substrate 9.

In other implementations, when the first bonding material 3 is heated to 180° C.~350° C., it is not melted into a liquid form, instead it connects the power chip 1 and the connection substrate 5 connected with the metal substrate 9 in the solid form. For example, when the first bonding material 3 is made of sintering silver, it can connect the power chip 1 with the connection substrate 5 connected with the metal substrate 9 without being melted into the liquid form.

It should be noted that in this embodiment, after the first bonding material 3 and the second bonding material 7 are heated to a temperature of 180° C.~350° C., one of them may be melted into the liquid form, while the other is still in the solid form. When the first bonding material 3 and the second bonding material 7 are both melted into the liquid form at the bonding temperature, it is preferable that the melting point of the second bonding material 7 is higher than the melting point of the first bonding material 3 to prevent the remelting of the second bonding material 7. The heating temperature of this step is lower than the heating temperature of step S302. Specifically, when the material of the first bonding material 3 is different from the material of the second bonding material 7, the second bonding material 7 can be heated at a higher temperature in the range of 180° C.~350° C., for example, 300° C., and the first bonding material 3 can be heated at a lower temperature in the range of 180° C.~350° C., for example, 200° C., when the connection substrate 5 connected with the metal substrate 9 and the power chip 1 are connected together, the second bonding material 7 may not be remelted, but the present disclosure is not limited thereto.

S304: Cooling the power chip, the first bonding material, the connection substrate, the second bonding material and the metal substrate to −10° C.~40° C. A coefficient of thermal expansion of the connection substrate is smaller than a coefficient of thermal expansion of the metal substrate, and the upper surface and the lower surface of the metal substrate are bendingly deformed toward the connection substrate during the cooling, and the upper surface of the metal substrate is formed as a curved surface protruding toward the connection substrate. In addition, the lower surface of the metal substrate may be formed as a curved surface protruding toward the connection substrate, an uneven surface or a surface of other shapes after the cooling.

This step is the same as step S103 in Embodiment 1. Please refer to the description in Embodiment 1.

S305: Processing the lower surface of the metal substrate into a plane. When the lower surface of the metal substrate is formed as a curved surface protruding toward the connection substrate, an uneven surface or a surface of other shapes after the cooling, it can be processed as a plane through a processing procedure.

This step is the same as step S104 in Embodiment 1. Please refer to the description in Embodiment 1.

Further, in this embodiment, the number of the power chip 1 may be one or more, and the structure thereof is the same as that of Embodiment 1. For details, please refer to the description in Embodiment 1.

Further, in this embodiment, the connection substrate 5 may include an insulation body portion 52, an upper connection portion 51 located on the upper surface of the insulation body portion 52, and a lower connection portion 53 located on the lower surface of the insulation body portion 52. The other structures of the connection substrate 5 are the same as those of Embodiment 1. For details, please refer to the description in Embodiment 1.

According to the power module and the production method of the same according to this embodiment, the metal substrate 9 is connected with the connection substrate 5 in a high temperature, and in the process of cooling from a high temperature to a low temperature, the upper surface and the lower surface of the metal substrate 9 are bendingly deformed toward the connection substrate 5, and the upper surface of the metal substrate 9 is formed as a curved surface protruding toward the connection substrate 5. Compared with the power module produced according to the prior art, the second bonding material 7 between the connection substrate 5 and the metal substrate 9 has a greater average edge thickness than that of the second solder 7', which reduces the thermal stress that the edge of the second bonding material 7 is subject to, thereby improving the reliability of the power module during temperature cycle. Of course, if the lower surface of the lower connection portion 53 of the connection substrate 5 is provided as a curved surface protruding toward the metal substrate 9 and/or a part of the edge of the lower connection portion 53 is removed, the average edge thickness of the second bonding material 7 can be further increased to improve the reliability of the power module.

According to the power module and the production method of the same according to this embodiment, the thickness of the thermal grease required to be filled between the lower surface of the metal substrate 9 and the heat sink, when the power module is mounted on the heat sink, can also be reduced by processing the lower surface of the metal substrate 9 formed as a curved surface into a plane, thereby reducing the thermal resistance between the power module and the heat sink and improving the heat dissipation efficiency of the power module.

In addition, in the power module and the production method of the same according to this embodiment, there's no need to perform pre-bending on the metal substrate 9, therefore, the controllability of the process precision is better, the production cost of the power module can be reduced, and the production time is reduced, thereby improving the production efficiency.

Embodiment 4

Figure 19:
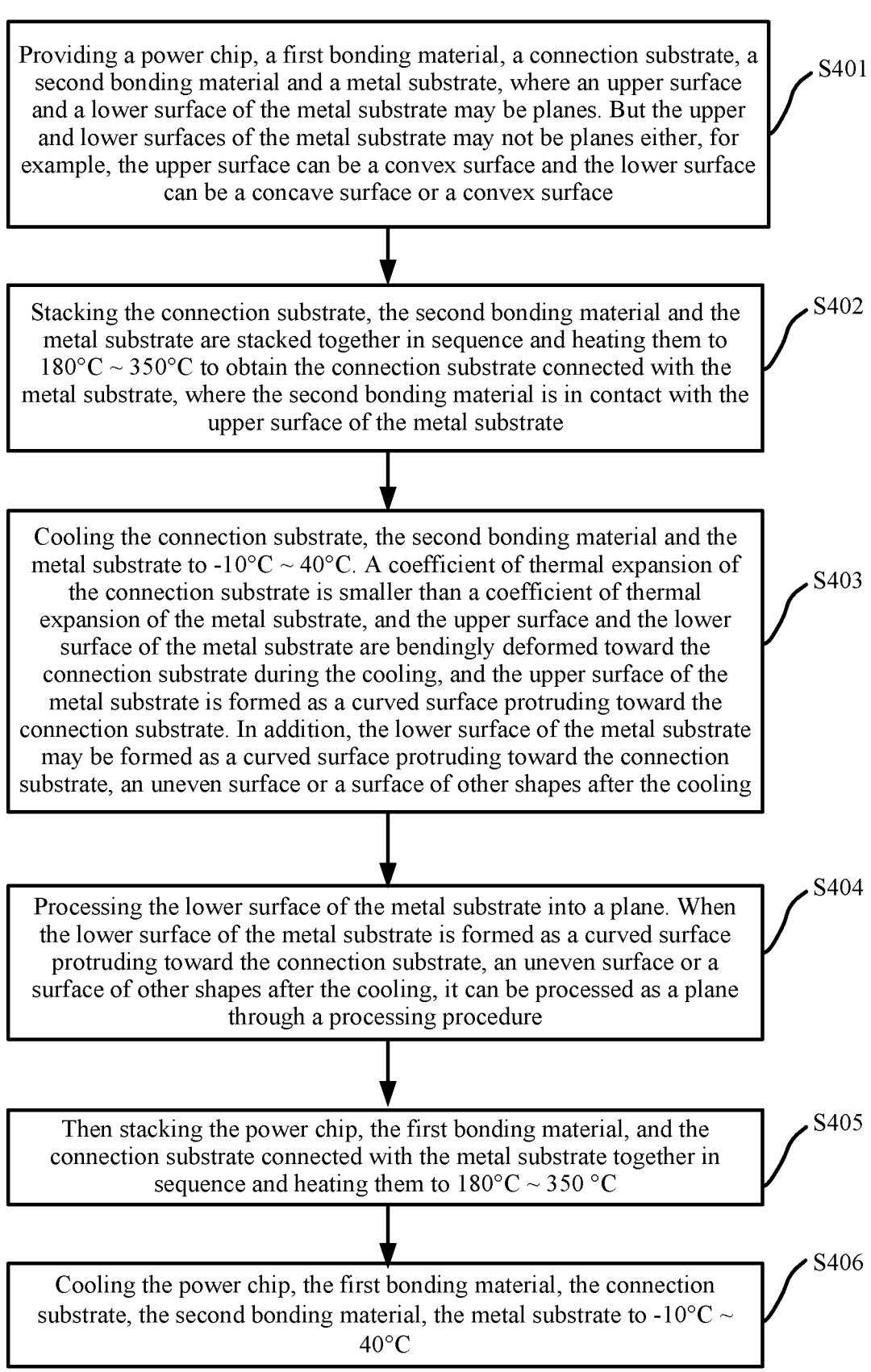
FIG. 19 is a flowchart diagram of a production method of a power module according to Embodiment 4 of the present disclosure.

FIG. 19 is a flowchart diagram of a production method of a power module according to this embodiment. As shown in FIG. 19, the production method of the power module of this embodiment includes:

S401: Providing a power chip, a first bonding material, a connection substrate, a second bonding material and a metal substrate, where an upper surface and a lower surface of the metal substrate may be planes. But the upper and lower surfaces of the metal substrate may not be planes either, for example, the upper surface can be a convex surface and the lower surface can be a concave surface or a convex surface.

This step is the same as step S101 in Embodiment 1. Please refer to the description in Embodiment 1.

S402: Stacking the connection substrate, the second bonding material and the metal substrate are stacked together in sequence and heating them to 180° C.~350° C. to obtain the connection substrate connected with the metal substrate, where the second bonding material is in contact with the upper surface of the metal substrate.

This step is the same as step S302 in Embodiment 3. Please refer to the description in Embodiment 3.

S403: Cooling the connection substrate, the second bonding material and the metal substrate to −10° C.~40° C. A coefficient of thermal expansion of the connection substrate is smaller than a coefficient of thermal expansion of the metal substrate, and the upper surface and the lower surface of the metal substrate are bendingly deformed toward the connection substrate during the cooling, and the upper surface of the metal substrate is formed as a curved surface protruding toward the connection substrate. In addition, the lower surface of the metal substrate may be formed as a curved surface protruding toward the connection substrate, an uneven surface or a surface of other shapes after the cooling.

Specifically, when the second bonding material 7 is cooled to −10° C.~40° C., the second bonding material 7 mechanically connects the connection substrate 5 and the metal substrate 9.

Meanwhile, since the coefficient of thermal expansion (CTE) of the connection substrate 5 is smaller than the CTE of the metal substrate 9, when the power module is cooled from a high temperature of 180° C.~350° C. to a low temperature of −10° C.~40° C., the shrinkage of the metal substrate 9 is larger than the shrinkage of the connection substrate 5, such that the power module is formed as a shape as shown in FIG. 5 when the temperature is lowered to −10° C.~40° C. And during the bending deformation of the metal substrate 9 and the connection substrate 5, although the second bonding material 7 is also bendingly deformed, its thickness is basically unchanged. Compared with the power module produced according to the method of the prior art, the second bonding material 7 has a larger average edge thickness than that of the second solder 7', thereby reducing the thermal stress that the edge is subject to, preventing cracking during temperature cycle, which increases the reliability of the module when being subject to temperature cycle.

Optionally, after cooling to −10° C.~40° C., the average edge thickness of the second bonding material 7 is greater than or equal to 0.8 times the center thickness of the second bonding material 7, and preferably, the average edge thickness of the second bonding material 7 is greater than or equal to the center thickness of the second bonding material 7.

S404: Processing the lower surface of the metal substrate into a plane. When the lower surface of the metal substrate is formed as a curved surface protruding toward the connection substrate, an uneven surface or a surface of other shapes after the cooling, it can be processed as a plane through a processing procedure.

This step is the same as step S104 in Embodiment 1. Please refer to the description in Embodiment 1.

S405: Then stacking the power chip, the first bonding material, and the connection substrate connected with the metal substrate together in sequence and heating them to 180° C.~350° C.

Similar to the second bonding material 7, in some implementations, when the first bonding material 3 is heated to 180° C.~350° C., it will also be melted into liquid form, thereby connecting the power chip 1 and the connection substrate 5 connected with the metal substrate 9 together. For example, when the first bonding material 3 is solder, it is melted into liquid form at a temperature of 180° C.~350° C. to implement connection between the power chip 1 and the connection substrate 5 connected with the metal substrate 9.

In other implementations, when the first bonding material 3 is heated to 180° C.~350° C., it is not melted into a liquid form, instead it connects the power chip 1 and the connection substrate 5 connected with the metal substrate 9 in solid form. For example, when the first bonding material 3 is made of sintering silver, it can connect the power chip 1 with the connection substrate 5 connected with the metal substrate 9 without being melted into liquid form.

It should be noted that in this embodiment, after the first bonding material 3 and the second bonding material 7 are heated to a temperature of 180° C.~350° C., one of them may be melted into the liquid form, while the other is still in the solid form. When the first bonding material 3 and the second bonding material 7 are both melted into the liquid form at the bonding temperature, it is preferable that the melting point of the second bonding material 7 is higher than the melting point of the first bonding material 3 to prevent the remelting of the second bonding material 7. The heating temperature of this step is lower than the heating temperature of step S402.

S406: Cooling the power chip, the first bonding material, the connection substrate, the second bonding material, the metal substrate to −10° C.~40° C.

Specifically, during the process of the first bonding material 3 being cooled to −10° C.~40° C., the first bonding material 3 mechanically connects the power chip 1 and the connection substrate 5 connected with the metal substrate 9. It can be understood that if the second bonding material 7 is remelted in step S405, in this step, it mechanically connects the metal substrate 9 and the connection substrate 5 again, and the average edge thickness of the second bonding material 7 is greater than or equal to 0.8 times the center thickness of the second bonding material 7. Preferably, the average edge thickness of the second bonding material 7 is greater than or equal to the center thickness of the second bonding material 7.

Further, in this embodiment, the number of the power chip 1 may be one or more, and the structure thereof is the same as that of Embodiment 1. For details, please refer to the description in Embodiment 1.

Further, in this embodiment, the connection substrate 5 may include an insulation body portion 52, an upper connection portion 51 located on the upper surface of the insulation body portion 52, and a lower connection portion 53 located on the lower surface of the insulation body portion 52. The other structures of the connection substrate 5 are the same as those of Embodiment 1. For details, please refer to the description in Embodiment 1.

According to the power module and the production method of the same according to this embodiment, a metal substrate 9 is connected with the connection substrate 5 in a high temperature, and in the process of cooling from a high temperature to a low temperature, the upper surface and the lower surface of the metal substrate 9 are bendingly deformed toward the connection substrate 5, and the upper surface of the metal substrate 9 is formed as a curved surface protruding toward the connection substrate 5. Compared with the power module produced according to the prior art, the second bonding material 7 between the connection substrate 5 and the metal substrate 9 has a greater average edge thickness than that of the second solder 7', which reduces the thermal stress that the edge of the second bonding material 7 is subject to, thereby improving the reliability of the power module during temperature cycle. Of course, if the lower surface of the lower connection portion 53 of the connection substrate 5 is provided as a curved surface protruding toward the metal substrate 9 and/or a part of the edge of the lower connection portion 53 is removed, the average edge thickness of the second bonding material 7 can be further increased to improve the reliability of the power module.

According to the power module and the production method of the same according to this embodiment, the thickness of the thermal grease required to be filled between the lower surface of the metal substrate 9 and the heat sink, when the power module is mounted on the heat sink, can also be reduced by processing the lower surface of the metal substrate 9 formed as a curved surface into a plane, thereby reducing the thermal resistance between the power module and the heat sink and improving the heat dissipation efficiency of the power module.

In addition, in the power module and the production method of the same according to this embodiment, there's no need to perform pre-bending on the metal substrate 9, therefore, the controllability of the process precision is better, the production cost of the power module can be reduced, and the production time is reduced, thereby improving the production efficiency.

Embodiment 5

Figure 20:
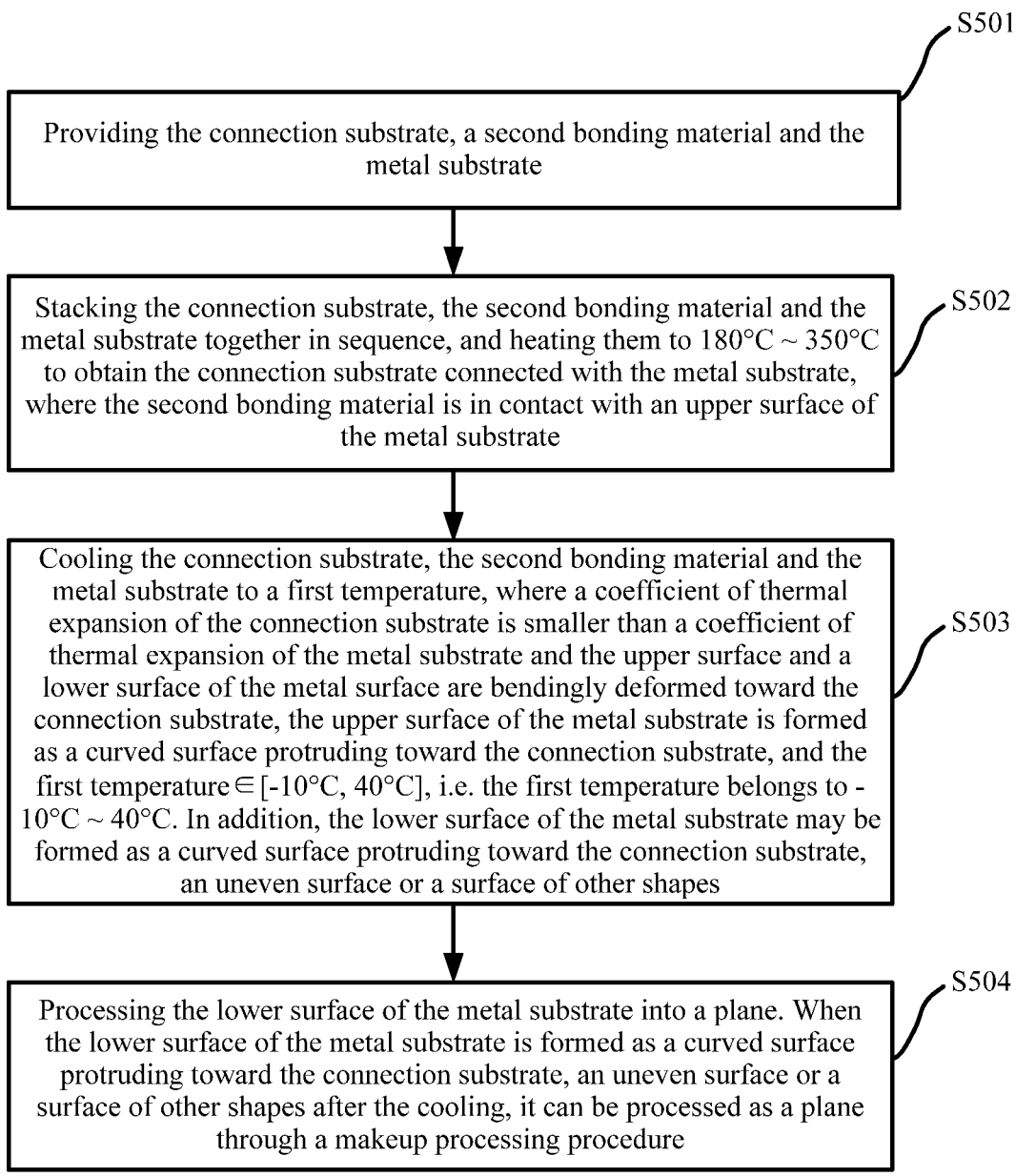
FIG. 20 is a flowchart diagram of a production method of a power module according to Embodiment 5 of the present disclosure.

FIG. 20 is a flowchart diagram of a production method of a power module according to this embodiment; FIG. 4 is a schematic structural diagram of a power module before cooling according to this embodiment. Referring to FIG. 4 and FIG. 20, the power module in this embodiment includes: a power chip, a connection substrate and a metal substrate, and the power chip is disposed above the connection substrate and the metal substrate is disposed under the connection substrate, and the production method of the power module according to this embodiment includes:

S501: Providing the connection substrate, a second bonding material and the metal substrate.

Optionally, both an upper surface and a lower surface of the provided metal substrate may be planes. But the upper and lower surfaces of the metal substrate may not be planes either, for example, the upper surface can be a convex surface and the lower surface can be a concave surface or a convex surface.

Specifically, the connection substrate 5 may be a DBC (Direct Bonding Copper) substrate, a DBA (Direct Bonding Aluminum) substrate, an AMB (Active Metal Bonding) substrate, a thick film metallization ceramic plate, an LTCC (Low Temperature Co-fired Ceramic) substrate, an IMS (Insulated Metal Substrate) substrate, a PCB (Printed Circuit Board), etc. Further, in this embodiment, the connection substrate 5 may also include an insulation body portion 52, an upper connection portion 51 located on an upper surface of the insulation body portion 52, and a lower connection portion 53 located on a lower surface of the insulation body portion 52. The other structures of the connection substrate 5 are the same as those of Embodiment 1. For details, please refer to the description in Embodiment 1.

A connection between the connection substrate 5 and the metal substrate 9 can be achieved by the second bonding material 7. Of course, in actual use, a person skilled in the art can select a suitable bonding material according to an expected heating temperature, or a person skilled in the art can also determine a suitable heating temperature according to a selected bonding material, and in this embodiment, the second bonding material 7 may be, for example, any one of: a solder, a sintering material and an adhesive material.

The metal substrate 9 may be a copper substrate or a substrate made of copper alloy. The metal substrate 9 made of the above two materials has good processability, but a metal substrate 9 made of other materials is not excluded in this embodiment either. It should be emphasized that no pre-bending operation is performed on the metal substrate 9 in this embodiment, for example, the metal substrate 9 used in this embodiment may be a metal substrate in a plane form with both its upper and lower surfaces being planes, as shown in FIG. 4.

The metal substrate 9 may be made of a ceramic-metal composite material such as an aluminum-silicon carbide composite material. In other words, a ceramic-metal composite substrate made of a ceramic-metal composite material is used as the metal substrate 9. Taking the aluminum-silicon carbide composite material as an example: since the difference in the coefficients of thermal expansion between the aluminum silicon carbide material and the connection substrate 5 is relatively small (the CTE of the metal substrate 9 is still larger than the CTE of the connection substrate 5), the reliability of the temperature cycle of the module can be further improved, but the processability of the aluminum silicon carbide material is extremely poor. In this case, aluminum of a certain thickness can be settled on a surface of the aluminum silicon carbide substrate to be processed, thereby forming an aluminum-silicon carbide composite substrate to satisfy the machinability requirement.

S502: Stacking the connection substrate, the second bonding material and the metal substrate together in sequence, and heating them to 180° C.~350° C. to obtain the connection substrate connected with the metal substrate, where the second bonding material is in contact with an upper surface of the metal substrate.

Specifically, in some implementations, when the second bonding material 7 is heated to 180° C.~350° C., it will also be melted into liquid form, thereby mechanically connecting the connection substrate 5 and the metal substrate 9 together. For example, when the second bonding material 7 is solder, it is melted into liquid form at a temperature of 180° C.~350° C. to implement the connection between the connection substrate 5 and the metal substrate 9.

In other implementations, when the second bonding material 7 is heated to 180° C.~350° C., it will not be melted into liquid form, instead, it connects the connection substrate 5 and the substrates 9 together in solid form. For example, when the second bonding material 7 is made of sintering silver, it can mechanically connect the connection substrate 5 and the metal substrate 9 without being melted into liquid form.

S503: Cooling the connection substrate, the second bonding material and the metal substrate to a first temperature, where a coefficient of thermal expansion of the connection substrate is smaller than a coefficient of thermal expansion of the metal substrate and the upper surface and a lower surface of the metal surface are bendingly deformed toward the connection substrate, the upper surface of the metal substrate is formed as a curved surface protruding toward the connection substrate, and the first temperature∈[−10° C., 40° C.], i.e. the first temperature belongs to −10° C.~40° C. In addition, the lower surface of the metal substrate may be formed as a curved surface protruding toward the connection substrate, an uneven surface or a surface of other shapes.

The thickness distribution of the second bonding material 7 is determined by the positional relationship between the upper surface of the metal substrate 9 and the lower surface of the connection substrate 5 under a high temperature state, and the thickness distribution of the second bonding material 7 is substantially unchanged during the subsequent cooling process. Therefore, for example, when the two surfaces are both planes, the average edge thickness of the second bonding material 7 is greater than or equal to 0.8 times the center thickness of the second bonding material 7 after the module is cooled from high temperature.

Specifically, when the second bonding material 7 is cooled to −10° C.~40° C., it mechanically connects the connection substrate 5 and the metal substrate 9. The cooling may be, for example, natural cooling, but additional manners may be used to accelerate the cooling rate, and a plurality times of heating and cooling may also be performed, and the present disclosure is not limited to the above manners.

Meanwhile, during the cooling process, since the coefficient of thermal expansion (CTE) of the connection substrate 5 is relatively small, for example, generally less than 10 ppm/K, and the CTE of the metal substrate 9 is relatively large, for example, about 17 ppm/K. Therefore, when the power module is cooled from a high temperature of 180° C.~350° C. to a low temperature of −10° C.~40° C., the shrinkage of the metal substrate 9 is greater than the shrinkage of the connection substrate 5, so that the power module is deformed into a shape as shown in FIG. 5 when the temperature is lowered to −10° C.~40° C. FIG. 5 is a schematic structural diagram of the power module after cooling according to this embodiment. Optionally, after cooling the connection substrate, the second bonding material and the metal substrate to −10° C.~40° C., the average edge thickness of the second bonding material 7 is greater than or equal to 0.8 times the center thickness of the second bonding material 7, and in the prior art, the edge thickness of the second solder 7' is generally much smaller than the center thickness thereof; preferably, the average edge thickness of the second bonding material 7 is greater than or equal to the center thickness of the second bonding material 7. A bonding material with a thicker edge has a good effect on improving the reliability of the temperature cycle.

S504: Processing the lower surface of the metal substrate into a plane. When the lower surface of the metal substrate is formed as a curved surface protruding toward the connection substrate, an uneven surface or a surface of other shapes after the cooling, it can be processed as a plane through a makeup processing procedure.

Specifically, the method for processing the lower surface of the metal substrate 9 into a plane may be any processing method in the prior art, for example, the curved lower surface of the metal substrate 9 may be processed into a plane as shown in FIG. 6 by milling through a machine tool or grinding through a grinder. FIG. 6 is a schematic structural diagram of the lower surface of the power module in FIG. 5 after being processed into a plane. Compared with other processing such as curved surface processing, plane processing has significant advantages such as being easy for investment on equipment and high production efficiency. Further, the process for processing the lower surface of the metal substrate 9 into a plane may be divided into several processes along the thickness direction to overcome the warp caused by the increase or decrease of the material after a single process. By means of dividing the process into several processes, step-by-step, each warp caused by the previous process would be eliminated by the subsequent process. Further, during the processing the lower surface of the metal substrate 9 into a plane, the amount of processing may be reduced by constraining the metal substrate (such as fixing the position of the hole via which the metal substrate and the heat sink are assembled to a plane or even a curved surface), which is especially beneficial for some large size modules. Since the lower surface of the metal substrate 9 is processed into a plane, when it is mounted on the heat sink, the thickness of the thermal grease used between the metal substrate 9 and the heat sink can be reduced, thereby reducing the thermal resistance between the metal substrate 9 and the heat sink and improving the heat dissipation efficiency.

Further, in this embodiment, the connection substrate may include: an insulation body portion, an upper connection portion located at an upper surface of the insulation body portion, and a lower connection portion located at a lower surface of the insulation body portion. Further, in this embodiment, a lower surface of the lower connection portion of the connection substrate is plane or a curved surface protruding toward the metal substrate. Further, in this embodiment, a part of an edge of the lower connection portion of the connection substrate may be removed, so that a thickness of the edge of the lower connection portion is smaller than a thickness of a center of the lower connection portion.

Specifically, referring to FIG. 4, the connection substrate 5 optionally includes an insulation body portion 52, an upper connection portion 51 located on an upper surface of the insulation body portion 52, and a lower connection portion 53 located on a lower surface of the insulation body portion 52. Where, before the heating step, the lower surface of the lower connection portion 53 may be a plane as shown in FIG. 4 or a curved surface protruding toward the metal substrate 9 as shown in FIG. 12, that is, the thickness of lower connection portion 53 may be uniform or non-uniform, and the present disclosure is not limited thereto. In order to increase the edge thickness of the second bonding material 7, a part of the edge of the lower connection portion 53 may be removed, as shown in FIG. 13 to FIG. 16, so that the edge thickness of the lower connection portion 53 is further smaller than the center thickness of the lower connection portion 53, so as to enable the edge part of the lower connection portion 53 to accommodate more second bonding material 7, rendering the edge thickness of the second bonding material 7 being relatively large after cooling to −10° C.~−40° C., thereby improving the stability of the power module. In this case, the lower connection portion 53 is generally not uniform in thickness. FIG. 13 is a schematic structural diagram of the power module after a part of the edge of the lower connection portion in FIG. 4 being removed. FIG. 14 is a partial enlarged diagram of a part A in FIG. 13; FIG. 15 is a schematic structural diagram of a power module after a part of the edge of the lower connection portion in FIG. 12 being removed; FIG. 16 is a partial enlarged diagram of a part F in FIG. 15.

In a first instance according to Embodiment 5 of the present disclosure, S501 further includes: providing the power chip and a first bonding material, and stacking the power chip, the first bonding material and the connection substrate together in sequence, and heating them to 180° C.~350° C. to obtain the connection substrate connected with the power chip.

Specifically, the power chip 1 may be any power chip used in the prior art, such as MOSFET, IGBT, SiC MOSFET, GaN HEMT and the like. The power chip 1 generally has three ports, for example, a MOSFET has two power electrodes (drain and source) and one control electrode (gate), an IGBT has two power electrodes (collector and emitter) and one control electrode (gate), but the present disclosure is not limited thereto. The power chip 1 can be a vertical or horizontal structure. When the vertical structure is adopted, a power electrode is integrated on each of a front side and a back side of the chip, and the control electrode is generally disposed on the front side of the chip. Taking MOSFET as an example, it is common that the source and the gate are disposed on the front side of the chip, and its bonding pad is generally a metallization layer of aluminum or aluminum alloy; a drain is disposed on the back side of the chip and it is generally processed into a solderable metallization surface. The back side of the power chip 1 can be connected to the connection substrate 5 by the first bonding material 3, and the electrode(s) on the front side of the power chip 1 is generally connected to a wiring layer of the connection substrate 5 by a wire bonding technology.

The first bonding material 3 may be any solder or sintering material (for example, sintering silver or sintering copper, etc.) used in the prior art by which a mechanical and thermal connection between the power chip 1 and the connection substrate 5 can be achieved.

In some implementations, the first bonding material 3 will be melted into liquid form after it is heated to 180° C.~350° C., thereby connecting the power chip 1 and the connection substrate 5 together. For example, when the first bonding material 3 is made of solder, it is melted into liquid at a temperature of 180° C.~350° C. to implement the connection between the power chip 1 and the connection substrate 5.

In other implementations, the first bonding material 3 will not be melted into liquid form after it is heated to 180° C.~350° C., instead, the first bonding material 3 connects the power chip 1 and the connection substrate 5 are together when it is in solid form. For example, when the first bonding material 3 is made of sintering silver, it can connect the power chip 1 and the connection substrate 5 without being melted into liquid from.

In addition, when the first bonding material 3 is cooled to −10° C.~−40° C., it mechanically connects the power chip 1 and the connection substrate 5. The cooling may be, for example, natural cooling, but additional manners may be used to accelerate the cooling rate, and a plurality times of heating and cooling may also be performed, and the present disclosure is not limited to the above manners.

In the first instance according to Embodiment 5 of the present disclosure, further, in S501, the first bonding material is heated to a third temperature within 180° C.~350° C. to obtain the connection substrate connected with the power chip, and in S502, the second bonding material is heated to a fourth temperature within 180° C.~350° C., where the third temperature is higher than the fourth temperature, and a melting point of the first bonding material is higher than a melting point of the second bonding material.

It should be noted that in this embodiment, after the first bonding material 3 and the second bonding material 7 are heated to a temperature of 180~350° C., one of them may be melted into liquid form while the other is still in solid form. And when the first bonding material 3 and the second bonding material 7 are both melted into the liquid form at the bonding temperature, it is preferable that the melting point of the first bonding material 3 is higher than the melting point of the second bonding material 7 to prevent remelting of the first bonding material 3. In this instance, the heating temperature of S501 is lower than the heating temperature of S502. Specifically, when the material of the first bonding material 3 is different from the material of the second bonding material 7, the first bonding material 3 can be heated at the third temperature which is a higher temperature in the range of 180° C.~350° C., for example, 300° C., and the second bonding material 7 can be heated at the fourth temperature which is a lower temperature in the range of 180° C.~350° C., for example, 200° C. Then, when the connection substrate 5 connected with the power chip 1 and the metal substrate 9 are connected together, the first bonding material 3 may not be remelted, but the present disclosure is not limited thereto.

Further, in this instance, the number of the power chips 1 may be one or more, and the structure thereof may be the same as that in Embodiment 1. For details, please refer to the description in Embodiment 1.

In a second instance according to Embodiment 5 of the present disclosure, S501 further includes: providing the power chip and a first bonding material; S502 further includes: stacking the power chip, the first bonding material and the connection substrate connected with the metal substrate together in sequence, and heating them to 180° C.~350° C., where the first bonding material is in contact with an upper surface of the connection substrate. Here, the connection substrate connected with the metal substrate is formed by first heating the connection substrate, the second bonding material and the metal substrate, and then it is connected with the power chip in the second heating.

The type and structure of the power chip as well as the material and use of the first bonding material provided according to the second instance are the same as those in the first instance of Embodiment 5 of the present disclosure. Please refer to the description in the above first instance.

Specifically, after the connection substrate 5 and the metal substrate 9 are connected together by the second bonding material 7, the power chip 1, the first bonding material 3 and the connection substrate 5 connected with the metal substrate 9 may be stacked together in sequence for subsequent operations. In actual practice, the connection substrate 5 connected with the metal substrate 9 may be first cooled to a certain temperature (for example, −10° C.~−40° C.) to facilitate stacking the power chip 1, the first bonding material 3 and the connection substrate 5 connected with the metal substrate 9 together, but the power chip 1, the first bonding material 3 and the connection substrate 5 connected with the metal substrate 9 may also be directly stacked together without cooling.

Similar to the second bonding material 7, in some implementations, when the first bonding material 3 is heated to 180° C.~350° C., it will also be melted into liquid form, thereby connecting the power chip 1 and the connection substrate 5 connected with the metal substrate 9 together. For example, when the first bonding material 3 is solder, it is melted into liquid form at a temperature of 180° C.~350° C. to implement connection between the power chip 1 and the connection substrate 5 connected with the metal substrate 9.

In other implementations, when the first bonding material 3 is heated to 180° C.~350° C., it is not melted into the liquid form, instead it connects the power chip 1 and the connection substrate 5 connected with the metal substrate 9 in solid form. For example, when the first bonding material 3 is made of sintering silver, it can connect the power chip 1 with the connection substrate 5 connected with the metal substrate 9 without being melted into liquid form.

In addition, when the first bonding material 3 is cooled to −10° C.~−40° C., it mechanically connects the power chip 1 and the connection substrate 5. The cooling may be, for example, natural cooling, but additional manners may be used to accelerate the cooling rate, and a plurality times of heating and cooling may also be performed, and the present disclosure is not limited to the above manners.

In the second instance according to Embodiment 5 of the present disclosure, further, in S502, the first bonding material is heated to a third temperature within 180° C.~350° C., the second bonding material is first heated to a fourth temperature within 180° C.~350° C., where the fourth temperature is higher than the third temperature, and a melting point of the second bonding material is higher than a melting point of the first bonding material.

It should be noted that in this instance, after the first bonding material 3 and the second bonding material 7 are heated to a temperature of 180° C.~350° C., one of them may be melted into a liquid form, while the other is still in a solid form. When the first bonding material 3 and the second bonding material 7 are both melted into the liquid form at the bonding temperature, it is preferable that the melting point of the second bonding material 7 is higher than the melting point of the first bonding material 3 to prevent remelting of the second bonding material 7. The heating temperature of the first bonding material 3 is lower than the heating temperature of the second bonding material 7. Specifically, when the material of the first bonding material 3 is different from the material of the second bonding material 7, the second bonding material 7 can be heated at the fourth temperature which is a higher temperature in the range of 180° C.~350° C., for example, 300° C., and the first bonding material 3 can be heated at the third temperature which is a lower temperature in the range of 180° C.~350° C., for example, 200° C., when the connection substrate 5 connected with the metal substrate 9 and the power chip 1 are connected together, the second bonding material 7 may not be remelted, but the present disclosure is not limited thereto.

Further, in this instance, the number of the power chips 1 may be one or more, and the structure thereof is the same as that of Embodiment 1. For details, please refer to the description in Embodiment 1.

In a third instance according to according to Embodiment 5 of the present disclosure, S501 further includes: providing the power chip and a first bonding material; further, this instance also includes S505: stacking the power chip, the first bonding material and the connection substrate connected with the metal substrate together in sequence, and heating them to 180° C.~350° C., where the first bonding material is in contact with an upper surface of the connection substrate, and then they are cooled to a second temperature∈ [−10° C., 40° C.].

The type and structure of the power chip as well as the material and use of the first bonding material provided according to the third instance are the same as those in the first instance of Embodiment 5 of the present disclosure. Please refer to the description in the above first instance.

Similar to the second bonding material 7, in some implementations, when the first bonding material 3 is heated to 180° C.~350° C., it will also be melted into liquid form, thereby connecting the power chip 1 and the connection substrate 5 connected with the metal substrate 9 together. For example, when the first bonding material 3 is solder, it is melted into liquid form at a temperature of 180° C.~350° C. to implement the mechanical connection between the power chip 1 and the connection substrate 5 connected with the metal substrate 9.

In other implementations, when the first bonding material 3 is heated to 180° C.~350° C., it is not melted into the liquid form, instead it connects the power chip 1 and the connection substrate 5 connected with the metal substrate 9 in the solid form. For example, when the first bonding material 3 is made of sintering silver, it can connect the power chip 1 with the connection substrate 5 connected with the metal substrate 9 without being melted into the liquid form.

In the third instance according to Embodiment 5 of the present disclosure, further, in S505, the first bonding material is heated to a third temperature within 180° C.~350° C., in S502, the second bonding material is heated to a fourth temperature within 180° C.~350° C., where the fourth temperature is higher than the third temperature, and a melting point of the second bonding material is higher than a melting point of the first bonding material.

It should be noted that in this instance, after the first bonding material 3 and the second bonding material 7 are heated to a temperature of 180° C.~350° C., one of them may be melted into the liquid form, while the other is still in the solid form. When the first bonding material 3 and the second bonding material 7 are both melted into the liquid form at the bonding temperature, it is preferable that the melting point of the second bonding material 7 is higher than the melting point of the first bonding material 3 to prevent remelting of the second bonding material 7. The heating temperature of the first bonding material 3 is lower than the heating temperature of the second bonding material 7. Specifically, when the material of the first bonding material 3 is different from the material of the second bonding material 7, the second bonding material 7 can be heated at the fourth temperature which is a higher temperature in the range of 180° C.~350° C., for example, 300° C., and the first bonding material 3 can be heated at the third temperature which is a lower temperature in the range of 180° C.~350° C., for example, 200° C., when the connection substrate 5 connected with the metal substrate 9 and the power chip 1 are connected together, the second bonding material 7 may not be remelted, but the present disclosure is not limited thereto.

Specifically, during the process of the first bonding material 3 being cooled to −10° C.~40° C., the first bonding material 3 mechanically connects the power chip 1 and the connection substrate 5 connected with the metal substrate 9. It can be understood that if the second bonding material 7 is remelted in step S505, in this step, it will mechanically connect the metal substrate 9 and the connection substrate 5, and the average edge thickness of the second bonding material 7 is greater than or equal to 0.8 times the center thickness of the second bonding material 7. Preferably, the average edge thickness of the second bonding material 7 is greater than or equal to the center thickness of the second bonding material 7.

Further, in this instance, the number of the power chips 1 may be one or more, and the structure thereof is the same as that of Embodiment 1. For details, please refer to the description in Embodiment 1.

In a fourth instance according to Embodiment 5 of the present disclosure, S501 includes: providing the power chip and a first bonding material; S502 further includes: stacking the power chip, the first bonding material and the connection substrate, the second bonding material and the metal substrate together in sequence, and heating them to 180° C.~350° C. simultaneously to obtain the connection substrate connected with the power chip and the metal substrate, where the second bonding material is in contact with the upper face of the metal substrate.

The type and structure of the power chip as well as the material and use of the first bonding material provided according to the fourth instance are the same as those in the first instance of Embodiment 5 of the present disclosure. Please refer to the description in the above first instance.

Specifically, in some implementations, when the first bonding material 3 is heated to 180° C.~350° C., it will also be melted into the liquid form, thereby mechanically connecting the power chip 1 and the connection substrate 5 together. For example, when the first bonding material 3 is solder, it is melted into the liquid form at a temperature of 180° C.~350° C. to implement connection between the power chip 1 and the connection substrate 5.

In other implementations, when the first bonding material 3 is heated to 180° C.~350° C., it is not melted into the liquid form, instead it connects the power chip 1 and the connection substrate 5 in the solid form. For example, when the first bonding material 3 is made of sintering silver, it can connect the power chip 1 with the connection substrate 5 without being melted into the liquid form.

It can be understood that, in some other implementations, one of the first bonding material 3 and the second bonding material 7 may be melted into the liquid form with the other being still in the solid form after they are heated to a temperature of 180° C.~350° C.

Further, in this instance, the number of the power chips 1 may be one or more, and the structure thereof is the same as that of Embodiment 1. For details, please refer to the description in Embodiment 1.

The first instance, the second instance, the third instance and the fourth instance of Embodiment 5, to a certain extent, correspond to Embodiment 2, Embodiment 3, Embodiment 4 and Embodiment 1.

In addition, neither of the first temperature, the second temperature, the third temperature and the fourth temperature is not used to define a certain temperature, instead, the temperature it indicates may fluctuate within a certain range.

According to the power module and the production method of the same according to this embodiment, a metal substrate 9 is connected with the connection substrate 5 in a high temperature, and in the process of cooling from a high temperature to a low temperature, the upper surface and the lower surface of the metal substrate 9 are bendingly deformed toward the connection substrate 5, and the upper surface of the metal substrate 9 is formed as a curved surface protruding toward the connection substrate 5. Compared with the power module produced according to the prior art, the second bonding material 7 between the connection substrate 5 and the metal substrate 9 has a greater average edge thickness than that of the second solder 7', which reduces the thermal stress that the edge of the second bonding material 7 is subject to, thereby improving the reliability of the power module during temperature cycle. Of course, if the lower surface of the lower connection portion 53 of the connection substrate 5 is provided as a curved surface protruding toward the metal substrate 9 and/or a part of the edge of the lower connection portion 53 is removed, the average edge thickness of the second bonding material 7 can be further increased to improve the reliability of the power module.

According to the power module and the production method of the same according to this embodiment, the thickness of the thermal grease required to be filled between the lower surface of the metal substrate 9 and the heat sink, when the power module is mounted on the heat sink, can be reduced by processing the lower surface of the metal substrate 9 formed as a curved surface into a plane, thereby reducing the thermal resistance between the power module and the heat sink and improving the heat dissipation efficiency of the power module.

In addition, in the power module and the production method of the same according to this embodiment, there's no need to perform pre-bending on the metal substrate 9, therefore, the controllability of the process precision is better, the production cost of the power module can be reduced, and the production time is reduced, thereby improving the production efficiency.

It should be noted that the above embodiments are only used to illustrate the technical solutions of the present disclosure, and are not intended to be limit the technical solutions of the present disclosure; although the present disclosure has been described in detail with reference to the foregoing embodiments, those of ordinary skilled in the art should understand that the technical solutions described in the foregoing embodiments may be modified, or some or all of the technical features may be equivalently replaced, and the modifications or substitutions do not deviate the essence of the corresponding technical solutions from the scope of the technical solutions of the implementations of the present disclosure.

What is claimed is:

1. A production method of a power module, wherein the power module comprises: a power chip, a connection substrate and a metal substrate, the power chip is disposed above the connection substrate and the metal substrate is disposed under the connection substrate, and
the production method comprises:
a first step: providing the connection substrate, a second bonding material and the metal substrate;
a second step: stacking the connection substrate, the second bonding material and the metal substrate together in sequence, and heating them to 180° C.~350° C. to obtain the connection substrate connected with the metal substrate, wherein the second bonding material is in contact with an upper surface of the metal substrate;

a third step: cooling the connection substrate, the second bonding material and the metal substrate to a first temperature, wherein a coefficient of thermal expansion of the connection substrate is smaller than a coefficient of thermal expansion of the metal substrate and the upper surface and a lower surface of the metal surface are bendingly deformed toward the connection substrate during the cooling, the upper surface of the metal substrate is formed as a curved surface protruding toward the connection substrate, and the first temperature is in a range of −10° C. to 40° C.;

a fourth step: processing the lower surface of the metal substrate into a flat surface.

2. The production method according to claim 1, wherein the first step further comprises: providing the power chip and a first bonding material, and stacking the power chip, the first bonding material and the connection substrate together in sequence, and heating them to 180° C.~350° C. to obtain the connection substrate connected with the power chip.

3. The production method according to claim 2, wherein in the first step, the first bonding material is heated to a third temperature within 180° C.~350° C. to obtain the connection substrate connected with the power chip, and in the second step, the second bonding material is heated to a fourth temperature within 180° C.~350° C. to connect the metal substrate and the connection substrate connected with the power chip, wherein the third temperature is higher than the fourth temperature, and a melting point of the first bonding material is higher than a melting point of the second bonding material.

4. The production method according to claim 1, wherein the first step further comprises: providing the power chip and a first bonding material; and the second step further comprises: stacking the power chip, the first bonding material and the connection substrate connected with the metal substrate together in sequence, and heating them to 180° C.~350° C., wherein the first bonding material is in contact with an upper surface of the connection substrate.

5. The production method according to claim 4, wherein in the second step, the second bonding material is heated to a fourth temperature within 180° C.~350° C. to obtain the connection substrate connected with the metal substrate, and then the first bonding material is heated to a third temperature within 180° C.~350° C. to connect the power chip and the connection substrate connected with the metal substrate, wherein the fourth temperature is higher than the third temperature, and a melting point of the second bonding material is higher than a melting point of the first bonding material.

6. The production method according to claim 1, wherein the first step further comprises: providing the power chip and a first bonding material; and the production method further comprises a fifth step: stacking the power chip, the first bonding material and the connection substrate connected with the metal substrate together in sequence, and heating them to 180° C.~350° C., wherein the first bonding material is in contact with an upper surface of the connection substrate, and then cooling them to a second temperature in a range of −10° C. to 40° C.

7. The production method according to claim 6, wherein in the second step, the second bonding material is heated to a forth temperature within 180° C.~350° C. to obtain the connection substrate connected with the metal substrate, and in the fifth step, the first bonding material is heated to a third temperature within 180° C.~350° C. to connect the power chip and the connection substrate connected with the metal substrate, wherein the forth temperature is higher than the third temperature, and a melting point of the second bonding material is higher than a melting point of the first bonding material.

8. The production method according to claim 1, wherein the first step comprises: providing the power chip and a first bonding material; and the second step further comprises: stacking the power chip, the first bonding material, the connection substrate, the second bonding material and the metal substrate together in sequence, and heating them to 180° C.~350° C. simultaneously to obtain the connection substrate connected with the power chip and the metal substrate, wherein the second bonding material is in contact with the upper surface of the metal substrate.

9. The production method according to claim 1, wherein after the cooling the connection substrate, the second bonding material and the metal substrate to the first temperature, an average edge thickness of the second bonding material is greater than or equal to 0.8 times a center thickness of the second bonding material.

10. The production method according to claim 1, wherein after the cooling the connection substrate, the second bonding material and the metal substrate to the first temperature, the average edge thickness of the second bonding material is greater than or equal to the center thickness of the second bonding material.

11. The production method according to claim 1, wherein the provided connection substrate comprises: an insulation body portion, an upper connection portion located at an upper surface of the insulation body portion, and a lower connection portion located at a lower surface of the insulation body portion.

12. The production method according to claim 11, wherein a lower surface of the lower connection portion of the provided connection substrate is a flat surface or a curved surface protruding toward the metal substrate.

13. The production method according to claim 12, wherein a part of an edge of the lower connection portion of the provided connection substrate is removed, so that a thickness of the edge of the lower connection portion is smaller than a thickness of a center of the lower connection portion.

14. The production method according to claim 1, wherein the metal substrate is made of a ceramic-metal composite material.

15. The production method according to claim 1, wherein in the first step, the upper and lower surfaces of the provided metal substrate are both flat surfaces.

16. A power module, comprising:

a power chip, a connection substrate and a metal substrate;

a lower surface of the power chip is connected with an upper surface of the connection substrate by a first bonding material;

a lower surface of the connection substrate is connected with an upper surface of the metal substrate by a second bonding material, and an average edge thickness of the second bonding material is greater than or equal to 0.8 times a center thickness of the second bonding material;

the upper surface of the metal substrate is a curved surface protruding toward the connection substrate, and a lower surface of the metal surface is a flat surface in a first temperature in a range of −10° C. to 40° C., wherein a coefficient of thermal expansion of the connection substrate is smaller than a coefficient of thermal expansion of the metal substrate.

17. The power module according to claim 16, wherein the average edge thickness of the second bonding material is greater than or equal to the center thickness of the second bonding material.

18. The power module according to claim 16, wherein the connection substrate comprises an insulation body portion, an upper connection portion located at an upper surface of the insulation body portion, and a lower connection portion located at a lower surface of the insulation body portion, wherein the upper connection portion is in contact with the first bonding material, and the lower connection portion is in contact with the second bonding material.

19. The power module according to claim 18, wherein a lower surface of the lower connection portion is a flat surface or a curved surface protruding toward the metal substrate.

20. The power module according to claim 19, wherein a part of an edge of the lower connection portion is removed, so that a thickness of the edge of the lower connection portion is smaller than a thickness of a center of the lower connection portion.

21. The power module according to claim 16, wherein the connection substrate is any one of a Direct Bonding Copper (DBC) substrate, a Direct Bonding Aluminum (DBA) substrate, a Low Temperature Co-fired Ceramic (LTCC) substrate, an Insulated Metal Substrate (IMS) substrate and a Printed Circuit Board (PCB) circuit board.

22. The power module according to claim 16, wherein, each of the number of the power chip, the number of the first bonding material, the number of the connection substrate and the number of the second bonding material is plural, and the number of the metal substrate is one;

a plurality of power chips and a plurality of first bonding materials are correspondingly stacked on a plurality of connection substrates; and the plurality of connection substrates and a plurality of second bonding materials are correspondingly stacked on the one metal substrate.

23. The power module according to claim 16, wherein each of the number of the power chip and the number of the first bonding material is plural, and each of the number of the connection substrate, the number of the second bonding material and the number of the metal substrate is one;

a plurality of power chips and a plurality of first bonding materials are stacked on the one connection substrate;

the one connection substrate and the one second bonding material are stacked on the one metal substrate.

24. The power module according to claim 16, wherein each of the first bonding material and the second bonding material is at least one of a solder, a sintering material and an adhesive material.

25. The power module according to claim 16, wherein melting point of the first bonding material is different from melting point of and the second bonding material.

26. The power module according to claim 16, wherein the metal substrate is made of a ceramic-metal composite material.

* * * * *